United States Patent
Kim et al.

(10) Patent No.: US 11,282,839 B2
(45) Date of Patent: Mar. 22, 2022

(54) SEMICONDUCTOR DEVICE

(71) Applicant: SAMSUNG ELECTRONICS CO., LTD., Suwon-si (KR)

(72) Inventors: Sungmin Kim, Suwon-si (KR); Daewon Ha, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 22 days.

(21) Appl. No.: 16/870,135

(22) Filed: May 8, 2020

(65) Prior Publication Data

US 2020/0373301 A1 Nov. 26, 2020

(30) Foreign Application Priority Data

May 21, 2019 (KR) ............ 10-2019-0059390

(51) Int. Cl.
*H01L 27/092* (2006.01)
*H01L 29/08* (2006.01)
(Continued)

(52) U.S. Cl.
CPC .. *H01L 27/0924* (2013.01); *H01L 21/823814* (2013.01); *H01L 21/823821* (2013.01); *H01L 21/823871* (2013.01); *H01L 23/5226* (2013.01); *H01L 23/5286* (2013.01); *H01L 29/0673* (2013.01); *H01L 29/0847* (2013.01); *H01L 29/42356* (2013.01); *H01L 21/02636* (2013.01); *H01L 21/823878* (2013.01)

(58) Field of Classification Search
CPC ............. H01L 27/0924; H01L 29/0847; H01L 23/5286; H01L 29/0673; H01L 29/42356; H01L 21/823821; H01L 21/823871; H01L 21/823814; H01L 23/5226; H01L 21/02636; H01L 21/823878; H01L 23/485; H01L 23/481; H01L 21/76898; H01L 29/41791; H01L 29/42392; H01L 29/78696; H01L 27/092; H01L 27/0207; H01L 27/0203; H01L 23/528; H01L 29/78

See application file for complete search history.

(56) References Cited

U.S. PATENT DOCUMENTS 6,037,822 A * 3/2000 Rao ............ H01L 23/481
257/698
6,759,282 B2 7/2004 Campbell et al.
(Continued)

FOREIGN PATENT DOCUMENTS

JP 2007521659 8/2007
JP 5487625 5/2014

*Primary Examiner* — Jonathan Han
(74) *Attorney, Agent, or Firm* — F. Chau & Associates, LLC

(57) ABSTRACT

A semiconductor device includes an arrive pattern including a channel region. The channel region is disposed between first and second source/drain patterns that are spaced apart from each other in a first direction. The channel region is configured to connect the first and second source/drain patterns to each other. A gate electrode is disposed on a bottom surface of the active pattern and is disposed between the first and second source/drain patterns. An upper interconnection line is disposed on a top surface of the active pattern opposite to the bottom surface of the active pattern and is connoted to the first source/drain pattern.

20 Claims, 23 Drawing Sheets

(51) Int. Cl.
*H01L 23/528* (2006.01)
*H01L 29/06* (2006.01)
*H01L 29/423* (2006.01)
*H01L 21/8238* (2006.01)
*H01L 23/522* (2006.01)
*H01L 21/02* (2006.01)

(56) References Cited

U.S. PATENT DOCUMENTS

| | | | |
|---|---|---|---|
| 6,838,332 B1 | 1/2005 | Sanchez et al. | |
| 7,402,866 B2 | 7/2008 | Liang et al. | |
| 7,666,723 B2 | 2/2010 | Frank et al. | |
| 7,960,245 B2* | 6/2011 | Bernstein | H01L 27/1203 |
| | | | 438/455 |
| 8,203,175 B2* | 6/2012 | Kuroda | H01L 27/228 |
| | | | 257/296 |
| 8,294,211 B2 | 10/2012 | Yang et al. | |
| 8,872,274 B2 | 10/2014 | Cohen et al. | |
| 9,171,887 B2* | 10/2015 | Yokoyama | H01L 27/12 |
| 9,647,085 B2 | 5/2017 | Huang et al. | |
| 9,780,210 B1* | 10/2017 | Goktepeli | H01L 21/76898 |
| 10,134,726 B2 | 11/2018 | Tsai et al. | |
| 2016/0358967 A1* | 12/2016 | Madurawe | H01L 27/14645 |
| 2018/0374791 A1* | 12/2018 | Smith | H01L 21/743 |

* cited by examiner

SEMICONDUCTOR DEVICE

CROSS-REFERENCE TO RELATED APPLICATION

This U.S. application claims priority under 35 U.S.C. 119 to Korean Patent Application No. 10-2019-0059390, filed on May 21, 2019, in the Korean Intellectual Property Office, the disclosure of which is incorporated by reference in its entirety herein.

1. TECHNICAL FIELD

The present disclosure relates to a semiconductor device, and in particular, to a semiconductor device including a field effect transistor and a method of fabricating the same.

2. DISCUSSION OF RELATED ART

There is an increasing demand for semiconductor devices with high reliability, high performance, and/or multiple functions. The structural complexity and/or integration density of semiconductor devices have been increased to satisfy these technical requirements.

SUMMARY

An exemplary embodiment of the present inventive concepts provides a semiconductor device with a high integration density and improved reliability.

According to an exemplary embodiment of the present inventive concepts, a semiconductor device includes an active pattern including a channel region. The channel region is disposed between first and second source/drain patterns that are spaced apart from each other in a first direction. The channel legion is configured to connect the first and second source/drain patterns to each other. A gate electrode is disposed on a bottom surface of the active pattern and is disposed between the first and second source/drain patterns. An upper interconnection line is disposed on a top surface of the active pattern opposite to the bottom surface of the active pattern and is connected to the first source/drain pattern.

According to an exemplary embodiment of the present inventive concepts, a semiconductor device includes first and second source/drain patterns that are spaced apart from each other in a first direction. An active pattern is disposed between opposing sidewalls of the first and second source/drain patterns. A gate electrode is disposed on a bottom surface of the active pattern. An insulating layer is disposed on a top surface of the active pattern. An upper interconnection line is disposed on the insulating layer and is electrically connected to the first source/drain patient. The first source/drain pattern comprises a first portion that is adjacent to a side surface of the active pattern and a second portion that extends from the first portion into the insulating layer. A largest width of the first portion in the first direction is smaller than a largest width of the second portion in the first direction.

According to an exemplary embodiment of the present inventive concepts, a semiconductor device includes a substrate including a PMOS region and an NMOS region. A plurality of first active regions is provided on the PMOS region. The plurality of first active regions extends in a first direction. A plurality of second active regions is provided on the NMOS region. The plurality of second active regions extends in the first direction. A gate electrode crosses the plurality of first active regions and the plurality of second active regions and extends in a second direction crossing the first direction. A portion of the gate electrode is positioned between bottom surfaces of the first active regions and a top surface of the substrate. First source/drain patterns are spaced apart from each other in the first direction and have the gate electrode interposed therebetween. Tire first source, drain patterns are connected to the plurality of first active regions. An upper interconnection line is disposed on a top surface of the first active reg on opposite to the bottom surface of the first active region. The upper interconnection line is connected to at least a portion of the first source/drain patterns.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

It should be noted that these figures are intended to illustrate the general characteristics of methods, structure and/or materials utilized in certain exemplary embodiments and to supplement the written description provided below. These drawings are not, however, to scale and may not precisely reflect the exact structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Exemplary embodiments of the present inventive concepts will now be described more fully with reference to the accompanying drawings, in which exemplary embodiments are show n.

Figure 1:
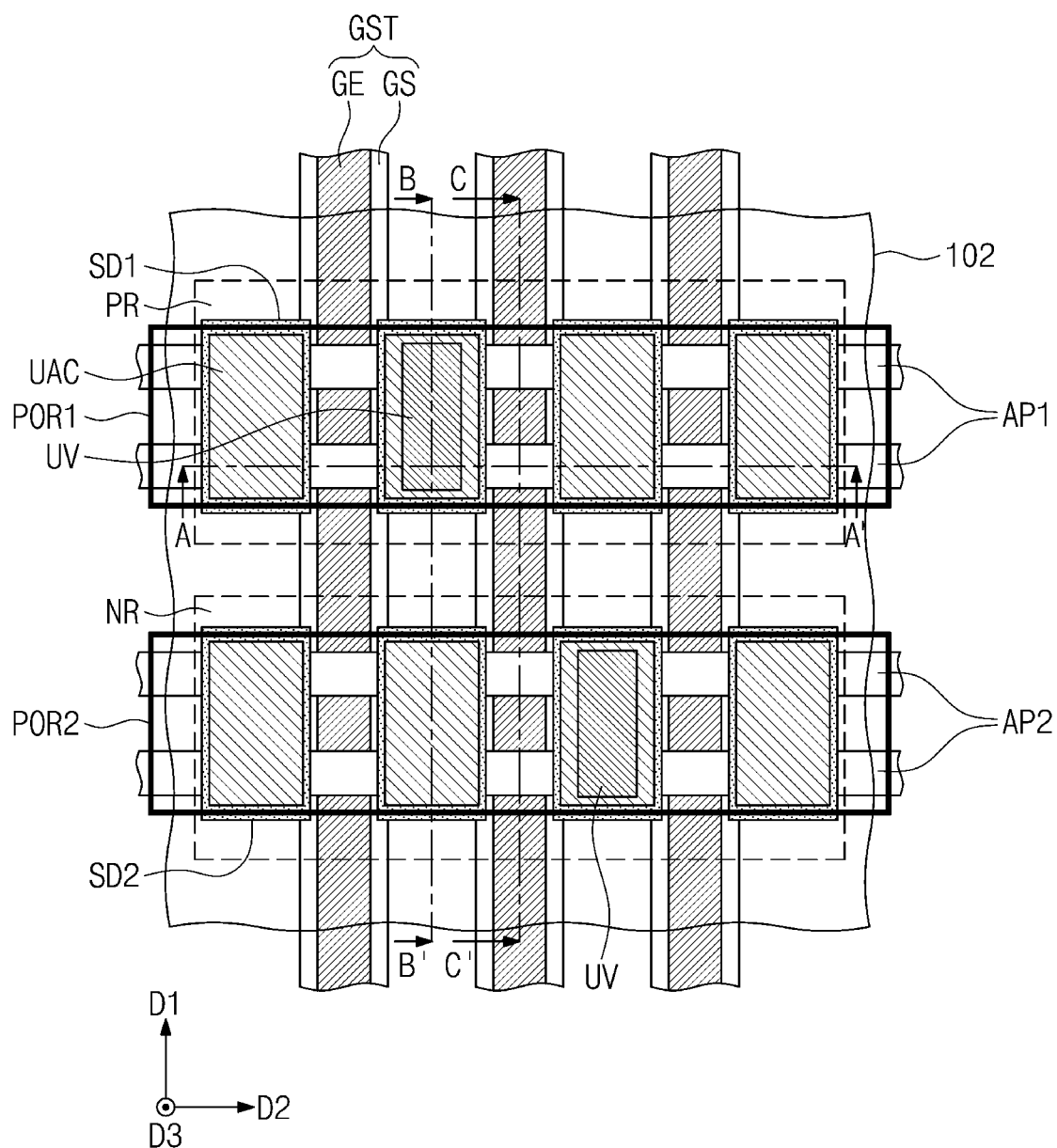
FIG. 1 is a top plan view illustrating a semiconductor device according to an exemplary embodiment of the present inventive concepts.
Figure 2A:
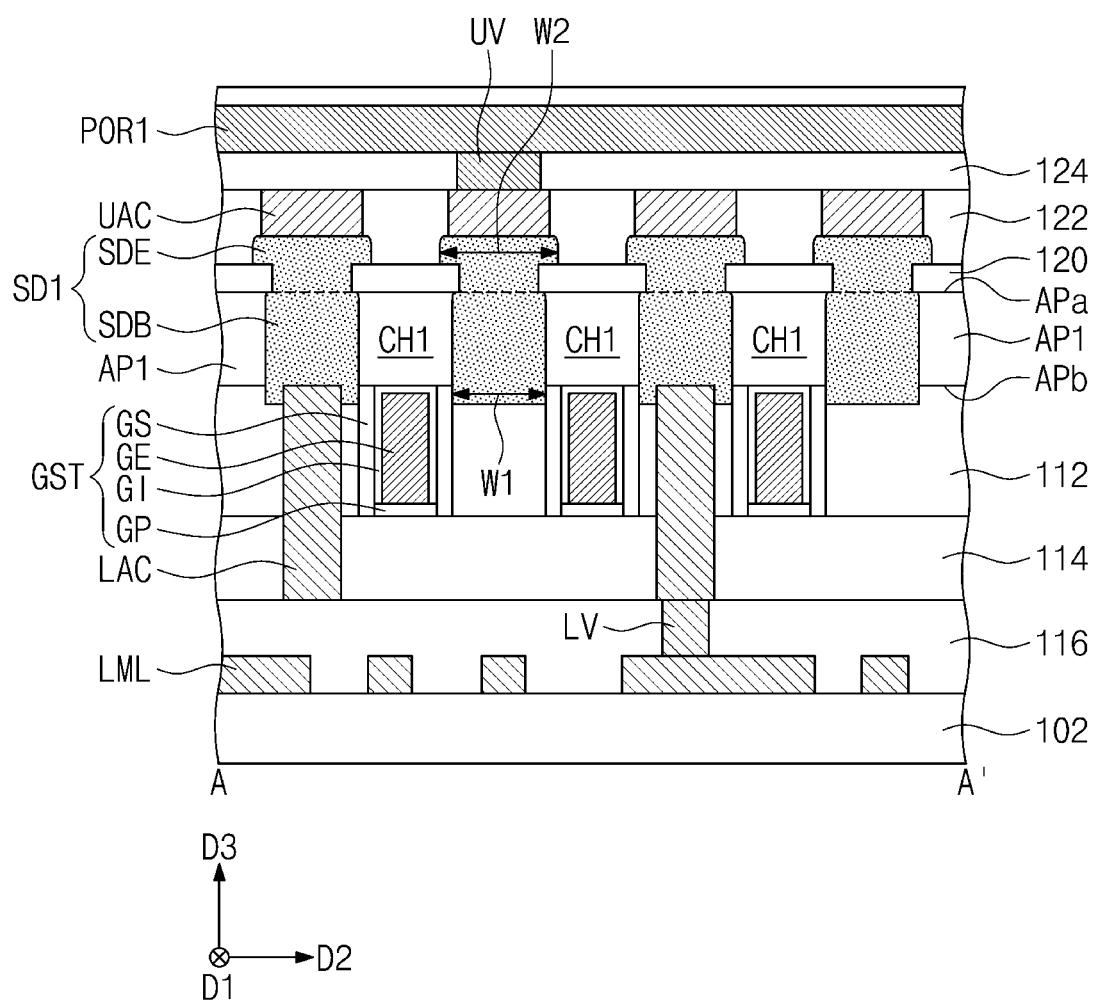
FIGS. 2A to 2C are cross-sectional views taken along lines A-A', B-B', and C-C', respectively, of FIG. 1 according to exemplary embodiments of the present inventive concepts.
Figure 2B:
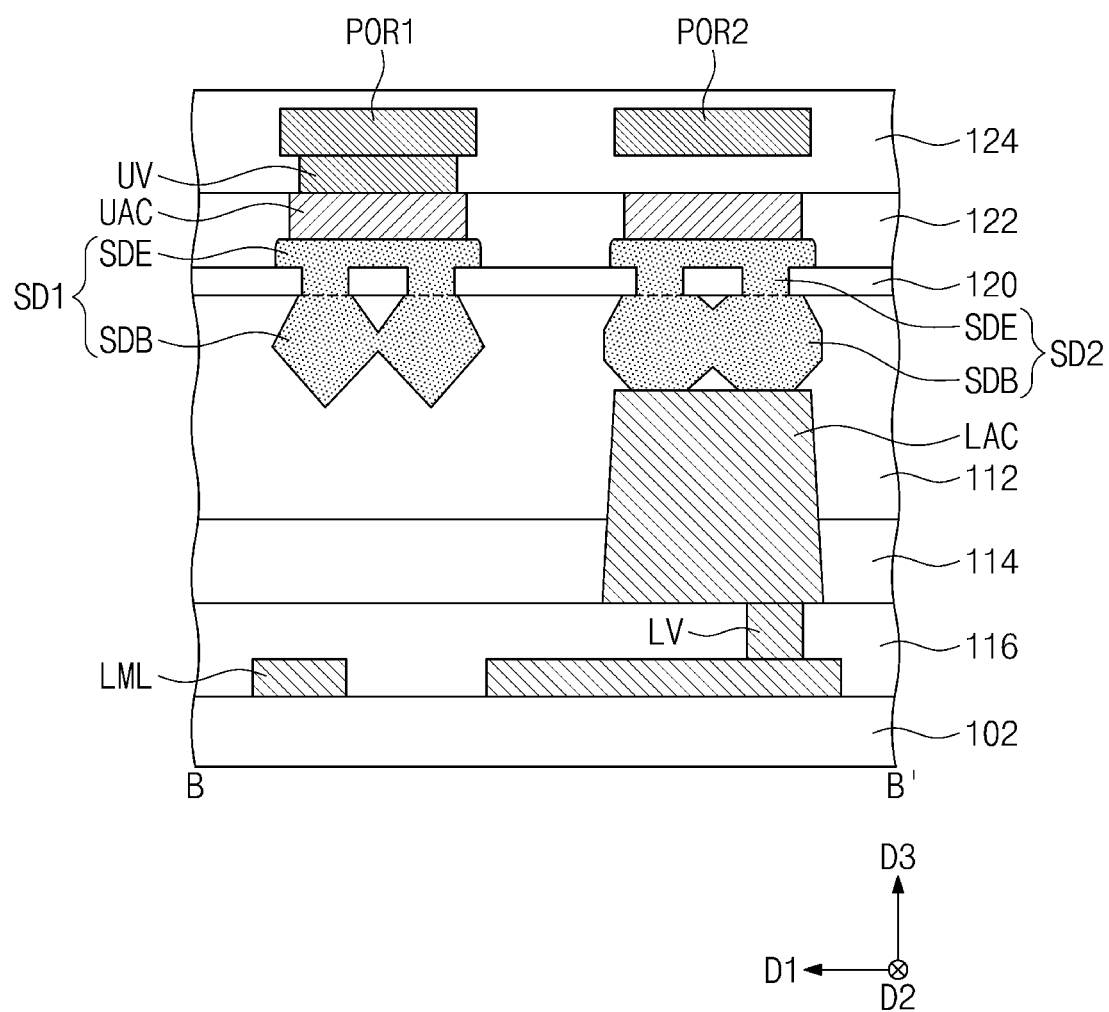
Figure 2C:
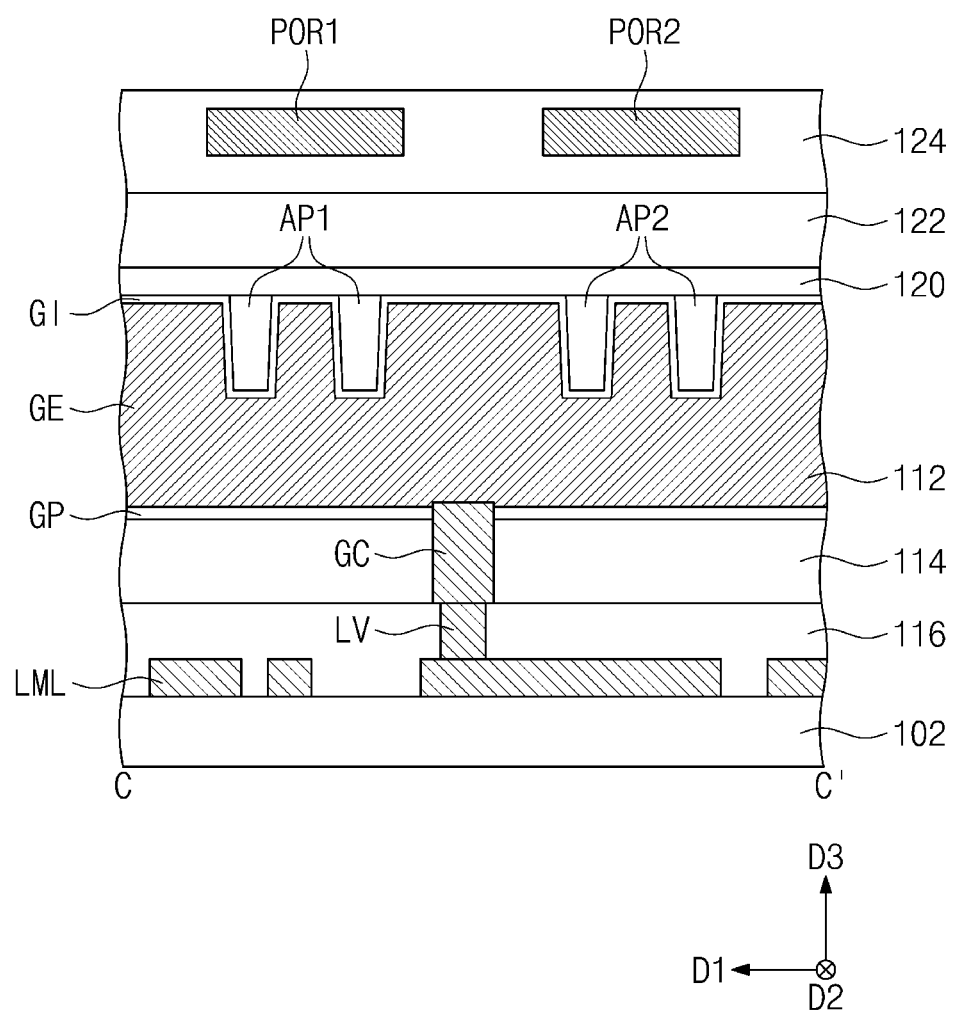

18) FIG. 1 is a top plan view illustrating a semiconductor device according to an exemplary embodiment of the present inventive concepts. FIGS. 2A to 2C are cross-sectional views taken along lines A-A', B-B', and C-C', respectively, of FIG. 1 according to exemplary embodiments of the present inventive concepts.

Referring to FIGS. 1 and 2A to 2C, a lower substrate 102 may include a p-channel metal-oxide field-effect transistor ("PMOSFET") region PR and an n-channel metal-oxide field-effect transistor ("NMOSFET") region NR. The lower substrate 102 may be a semiconductor substrate, which is formed of or includes silicon, germanium, or silicon-germanium, or a compound semiconductor or substrate. For example, the lower substrate 102 may be a silicon wafer. However, exemplary embodiments of the present inventive concepts are not limited thereto.

In an exemplary embodiment, the PMOSFET and NMOSFET regions PR and NR may be logic cell regions, on which logic transistors constituting a logic circuit of a semiconductor device are formed. For example, logic transistors constituting a processor core or I/O terminals may be disposed on the logic cell region of the lower substrate 102. The PMOSFET region PR and the NMOSFET region NR may include some of the logic transistors. The PMOSFET region PR and the NMOSFET region NR may be spaced apart front each other in a first direction D1. Each of the PMOSFET region PR and the NMOSFET region NR may extend in a second direction D2 that is perpendicular to the first direction D1.

A plurality of active patterns AP1 and AP2 extending in the second direction D2 may be provided on the PMOSFET region PR and the NMOSFET region NR. For example, as shown in the exemplary embodiment of FIG. 1, the active patterns AP1 and AP2 may include first active patterns AP1 on the PMOSFET region PR and second active patterns AP2 on the NMOSFET region NR. The first and second active patterns AP1 and AP2 may be provided on a top surface of the lower substrate 102 (e.g., in the third direction D3) and may have a fin-shape structure protruding in the third direction D3 that is perpendicular to the lop surface of the lower substrate 102. Each of the first and second active patterns AP1 and AP2 may include a bottom surface APb, which faces the top surface of the lower substrate 102, and a top surface APa, which is opposite to the bottom surface APb (e.g., in the third direction D3).

In the present specification, spatially relative terms, such as "beneath", "below", "lower", "bottom", "top", "above", "upper" and the like may be used herein for ease of description to describe the relationship of one element or feature to other element(s) or feature(s) as illustrated in the figures. It will be understood that the spatially relative terms are intended to encompass different orientations of the device in use or operation in addition to the orientation depicted in the figures. For example, as shown in FIGS. 6 to 11B, if the device in the figures is turned over, elements described as "below" or "beneath" other elements or features would then be oriented "above" the other elements or features. Therefore, the exemplary term "below" can encompass both an orientation of above and below. Similarly, a semiconductor that extends in the first direction D1 may be rotated to change the direction of the semiconductor to the second direction D2, the third direction D3, etc. The semiconductor device according to exemplary embodiments of the present inventive concepts may be otherwise oriented and the spatially relative descriptors used herein interpreted accordingly.

Gate electrodes GE may cross the first and second active patterns AP1 and AP2 and extend in the first direction D1. The gate electrodes GE may be spaced apart from each other in the second direction D2. The gate electrodes GE may overlap with channel regions CH1, when viewed in a plan view. Each of the gate electrodes GE may be disposed to face a bottom surface of each of the channel regions CH and two side surfaces of each of the channel regions, which are opposite to each other and which extend in the third direction D3 and are spaced apart in the first direction D1 (see FIG. 2C). The gate electrodes GE may be formed of or include at least one of, for example, conductive metal nitrides (e.g., titanium nitride or tantalum nitride) or metallic materials (e.g., titanium, tantalum, tungsten, copper, or aluminum). However, exemplary embodiments of the present inventive concepts are not limited thereto. A portion of the gate electrodes GE may be positioned between (e.g., spaced apart in the third direction D3 between) the bottom surfaces APb of the first and second active patterns AP1 and AP2 and the top surface of the lower substrate 102, as shown in FIG. 2A. In addition, the uppermost surface of the gate electrodes GE may be positioned at a level that is not higher titan the level of the top surfaces APa of the first and second active patterns AP1 and AP2. For example, the distance between the top surface of the lower substrate to the uppermost surface of the gate electrodes (e.g., in the third direction D3) may be less than or equal to the distance (e.g., in the third direction D3) between the top surface of the lower substrate and the top surfaces APa of the first and second active patterns AP1 and AP2.

A pair of gate spacers GS may be respectively disposed on two opposite sidewalls of each of the gate electrodes GE. The gate spacers GS may extend along the gate electrodes GE in the first direction D1. Bottom surfaces of the gate spacers GS may be located at a level drat is lower than bottom surfaces of the gate electrodes GE. For example, the distance (e.g., in the third direction D3) between the top surface of the lower substrate to the bottom surfaces of the gate spacers GS may be less than the distance (e.g., in the third direction D3) between the top surface of the lower substrate to the bottom surfaces of the gate electrodes GE. The bottom surfaces of the gate spacers GS may be coplanar with a bottom surface of a first lower insulating layer 112 to be described below. The gate spacers GS may be formed of or include at least one of SiCN, SiCON, or SiN. In an exemplary embodiment, the gate spacers GS may have a multi-layered structure including at least two layers, each of which is made of SiCN, SiCON, or SiN. However, exemplary embodiments of the present inventive concepts are not limited thereto.

Gate dielectric patterns GI may be interposed between the gate electrodes GE and the first and second active patterns AP1 and AP2 Each of the gate dielectric patterns GI may extend along a top surface (e.g., in the third direction D3) of a corresponding one of the gate electrodes GE. Each of the gate dielectric patterns GI may cover a bottom surface (e.g., in the third direction D3) and both side surfaces of each of the channel regions CH1 which extend in the third direction D3 and are spaced apart in the first direction D1. The gate dielectric patterns GI may be formed of or include at least one of high-k dielectric materials. Examples of the high-k dielectric materials may include at least one selected from: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. However, exemplary embodiments of the present inventive concepts are not limited thereto.

A gate capping pattern GP may be disposed on the bottom surface (e.g., in the third direction D3) of each of the gate electrodes GE. The gate capping patterns GP may extend along the gate electrodes GE in the first direction D1. The gate capping patterns GP may include a material that has an etch selectivity with respect to first and second lower insulating layers 112 and 114 to be described below. For example, the gate capping patterns GP may be formed of or include at least one of SiON, SiCN, SiCON, or SiN. However, exemplary embodiments of the present inventive concepts are not limited thereto.

First source/drain patterns SD1 may be provided on side surfaces of the first active patterns AP1. The first source/drain patterns SD1 may include impurities of a first conductivity type (e.g., p-type). A first channel region CH1 may be interposed between a pair of the first source/drain patterns SD1. Second source/drain patterns SD2 may be disposed on side surfaces of the second active patterns AP2. The second source/drain patterns SD2 may include impurities of a second conductivity type (e.g., n-type). A second channel region CH2 may be interposed between a pair of the second source/drain patterns SD2.

The first and second source/drain patterns SD1 and SD2 may be epitaxial patterns that are formed by a selective epitaxial growth process. Bottom surfaces of the first and second source/drain patterns SD1 and SD2 may be positioned at a level that is lower than the bottom surfaces of the first and second channel regions CH1 and CH2. For example, the distance (e.g., in the third direction D3) between the top surface of the lower substrate 102 to the bottom surfaces of the first and second source/drain patterns SD1 and SD2 may be less than the distance (e.g., in the third direction) between the top surface of the lower substrate to the bottom surfaces of the first and second channel regions. The first and second source/drain patterns SD1 and SD2 may have top surfaces that are positioned at a higher level than the top surfaces of the first and second channel regions CH1 and CH2. For example, the distance (e.g., in the third direction D3) between the top surface of the lower substrate 102 to the top surfaces of the first and second source/drain patterns SD1 and SD2 may be greater than the distance (e.g., in the third direction) between the top surface of the lower substrate to the top surfaces of the first and second channel regions CH1 and CH2. The first source/drain patterns SD1 may include a semiconductor material (e.g., SiGe), whose lattice constant is greater than the lattice constant of the lower substrate 102. In this exemplary embodiment, the first source/drain patterns SD1 may exert a compressive stress to the first channel regions CH1. In an exemplary embodiment, the second source/drain patterns SD2 may include the same semiconductor material (e.g., Si) as the material of the lower substrate 102.

The first source/drain patterns SD1 may penetrate a first upper insulating layer 120 to be described below and may be extended to cover a portion of a top surface of the first upper insulating layer 120. Each of the first source/drain patterns SD1 may include a first portion SDB and a second portion SDE extended from the first portion SDB (e.g., in the third direction D3). The first portion SDB of the first source/drain patterns SD1 may be positioned between opposite sidewalls of the first active patterns AP1 (e.g., in the second direction D2). The second portion SDE of the first source/drain patterns SD1 may be located at a vertical level higher than the top surface APa of the first active pattern AP1. For example, the distance (e.g., in the third direction D3) between the top surface of the lower substrate 102 to the second portion SDE of the first source/drain patterns SD1 may be greater than the distance (e.g., in the third direction D3) between the top surface of the lower substrate to the top surface APa of the first active pattern AP1. As shown in FIG. 2A, the largest width W2 (e.g., length in the second direction D2) of the second portion SDE of the first source/drain patterns SD1 may be larger than the largest width W1 (e.g., length in the second direction D2) of the first portion SDB of the first source/drain patterns SD1. For example, the first source/drain patients SD1 may have the largest width at a level that is higher (e.g., in the third direction D3) than the top surface APa of the first active patterns AP1.

A first upper insulating layer 120, a second upper insulating layer 122, and a third upper insulating layer 124 may be sequentially stacked on the top surface APa of the first active pattern AP1. For example, as shown in FIG. 2A, the second upper insulating layer 122 may be disposed directly on a top surface of the first upper insulating layer 120 (e.g., in the third direction D3). The third upper insulating layer 124 may be disposed directly on a top surface of the second upper insulating layer 122 (e.g., in the third direction D3).

Each of the first to third upper insulating layers 120, 122, and 124 may include a silicon oxide layer or a silicon oxynitride layer. However, exemplary embodiments of the present inventive concepts are not limited thereto.

Upper contacts UAC may penetrate the second upper insulating layer 122 and may be electrically connected to the first and second source/drain patterns SD1 and SD2. The upper contacts UAC may have bar-shape patterns extending in the first direction D1. For example, as shown in the exemplary embodiment of FIG. 2A, the upper contacts UAC may be disposed directly on a top surface of the second portion SDE of the first source/drain patterns SD1 and second source/drain patterns SD2 (e.g., in the third direction D3).

A first upper interconnection line POR1, a second upper interconnection line POR2, and upper vias UV may be provided in the third upper insulating layer 124. For example, as shown in FIG. 2A, a bottom surface of the upper vias UV (e.g., in the third direction D3) may directly contact a top surface (e.g., in the third direction D3) of the upper contacts UAC. A bottom surface of the first upper interconnection line POR1 may contact a top surface of the upper vias UV. The upper vias UV may connect the first upper interconnection line POR1 and second upper interconnection line POR2 to the upper contacts UAC. The first upper interconnection line POR1 and the second upper interconnection line POR2 may be a power rail, such as a buried power rail. For example, the first upper interconnection line POR1 and the second upper interconnection line POR2 may be applied with a power voltage or a ground voltage. The first upper interconnection line POR1 may be connected to at least one of the first source/drain patterns SD1 through the upper via UV. The second upper interconnection line POR2 may be connected to at least one of the second source/drain patterns SD2 through the upper via UV. The first upper interconnection line POR1 may be used to apply the power voltage to the first source/drain patterns SD1, and the second upper interconnection line POR2 may be used to apply the ground voltage to the second source/drain patterns SD2.

The first upper interconnection line POR1 and the second upper interconnection line POR2 may extend in the second direction D2. A width (e.g., length in the first direction D1) of the first upper interconnection line POR1 may be larger than a width (e.g., length in the first direction D1) of the first active pattern AP1. The first upper interconnection line POR1 may at least partially overlap (e.g., in the third direction D3) each of the first source/drain patterns SD1, which are disposed below the same, when viewed in a plan view. Similarly, a width (e.g., length in the first direction D1) of the second upper interconnection line POR2 may be larger than a width (e.g., length in the first direction D1) of the second active pattern AP2. The second upper interconnection line POR2 may at least partially overlap (e.g., in the third direction D3) each of the second source/drain patterns SD2, which are disposed below the same, when viewed in a plan view.

A first lower insulating layer 112, a second lower insulating layer 114, and a third lower insulating layer 116 may be disposed between the first and second active patterns AP1 and AP2 and the lower substrate 102.

The first lower insulating layer 112 may be disposed on the bottom surfaces APb of the first and second active patterns AP1 and AP2. For example, a top surface (e.g., in the third direction D3) of the first lower insulating layer 112 may be disposed directly on the bottom surface APb of the first and second active patterns AP1, AP2. The first lower insulating layer 112 may cover the gate spacers GS and the first and second source/drain patterns SD1 and SD2. A bottom surface (e.g., in the third direction D3) of the first lower insulating layer 112 may be substantially coplanar with bottom surfaces of the gate capping patterns GP and the bottom surfaces of the gate spacers GS. The second lower insulating layer 114 may be formed on the bottom surface of the first lower insulating layer 112 and may cover the gate capping patterns GP. For example, the top surface (e.g., in the third direction D3) of the second lower insulating layer 114 may be disposed directly on the bottom surface of the first lower insulating layer 112. The first and second lower insulating layers 112 and 114 may include, for example, a silicon oxide layer. However, exemplary embodiments of the present inventive concepts are not limited thereto.

Lower contacts LAC may be disposed to penetrate the first and second lower insulating layers 112 and 114 and may be electrically connected to the first and second source/drain patterns SD1 and SD2. For example, contact holes may be formed in the first and second lower insulating layers 112 and 114 to penetrate the first and second lower insulating layers 112 and 114 and to expose the first or second source/drain pattern SD1 and SD2. The lower contact LAC may be provided in the contact hole. The lower contacts LAC may be disposed between a pair of the gate electrodes GE. The lower contacts LAC may extend from the first portion SDB of the first source/drain patterns SD1 to a bottom surface (e.g., in the third direction D3) of the second lower insulating layer.

Lower interconnection lines LML and lower vias LV may be provided in the third lower insulating layer 116. For example, as shown in the exemplary embodiment of FIG. 2A, the bottom surface (e.g., in the third direction D3) of the lower contacts LAC may be disposed on a top surface of the third lower insulating layer 116 and may directly contact a top surface of the lower substrate 102. However, exemplary embodiments of the present inventive concepts are not limited thereto. The lower vias LV may connect the lower contacts LAC to the lower interconnection lines LML. For example, as shown in FIG. 2A a top surface (e.g., in the third direction D3) of the lower vias LV may contact a bottom surface (e.g., in the third direction D3) of the lower contacts LAC. A top surface (e.g., in the third direction D3) of the lower interconnection lines LML may contact a bottom surface (e.g., in the third direction D3) of the lower vias LV.

As shown in FIG. 2C, gate contacts GC may be provided to penetrate the second lower insulating layer 114 and the gate capping patterns GP and may be electrically connected to the gate electrodes GE. In an exemplary embodiment, the gate contact GC may be disposed between the PMOSFET and NMOSFET regions PR and NR, when viewed in a plan view. For example, the gate contact GC may be spaced apart from the PMOSFET and NMOSET regions PR and NR in the first direction D1. The gate contact GC may penetrate the gate capping pattern GP and may be in contact with a bottom surface of the gate electrode GE. A bottom surface (e.g., in the third direction D3) of the gate contact GC may be coplanar with a bottom surface (e.g., in the third direction D3) of the second lower insulating layer 114. The gate contact GC extends in a downward direction to the lower interconnection lines LML in an opposite direction as the upper contacts UAC which extend upwardly to the first and second upper interconnection lines POR1 and POR2.

Figure 3:
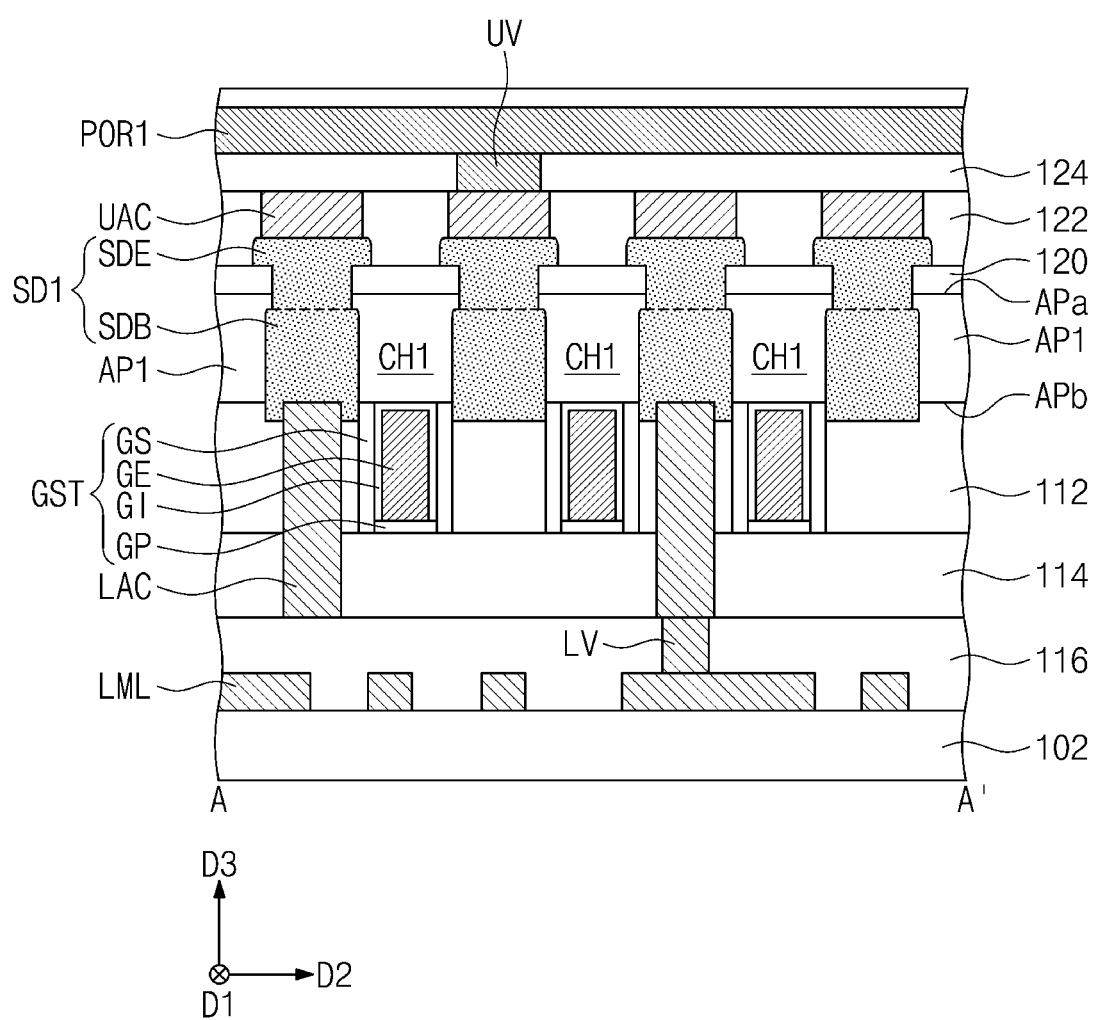
FIG. 3 is a cross-sectional view taken along line A-A' of FIG. 1 illustrating a semiconductor device according to an exemplary embodiment of the present inventive concepts.

FIG. 3 is a cross-sectional view taken along line A-A' of FIG. 1 according to an exemplary embodiment of the present inventive concepts.

Referring to FIG. 3, unlike the exemplary embodiment shown in FIG. 2A, the exemplary embodiment in FIG. 3 includes a top surface of the first active pattern AP1 that is positioned at a level higher than an interface between the first and second portions SDB and SDE of the first source/drain pattern SD1. For example, the distance between the top surface (e.g., in the third direction D3) of the lower substrate 102 to the top surface (e.g., in the third direction D3) of the first active pattern AP1 is greater than the distance between the top surface of the lower substrate to the interface between the first and second portions SDB and SDE of the first source/drain pattern SD1.

Figure 4A:
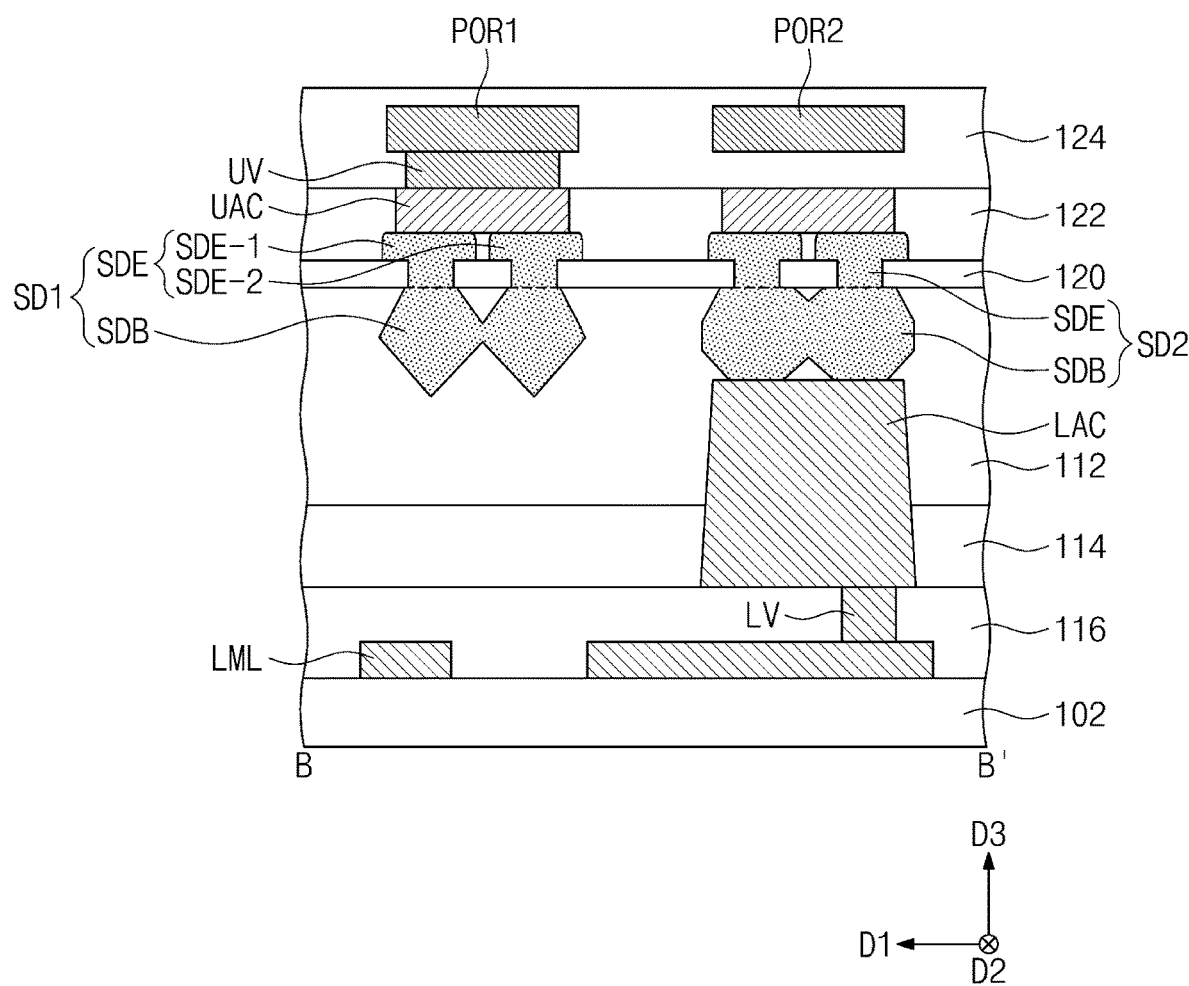
FIGS. 4A and 4B are cross-sectional views taken along line A-A' of FIG. 1 illustrating a semiconductor device according to exemplary embodiments of the present inventive concepts.
Figure 4B:
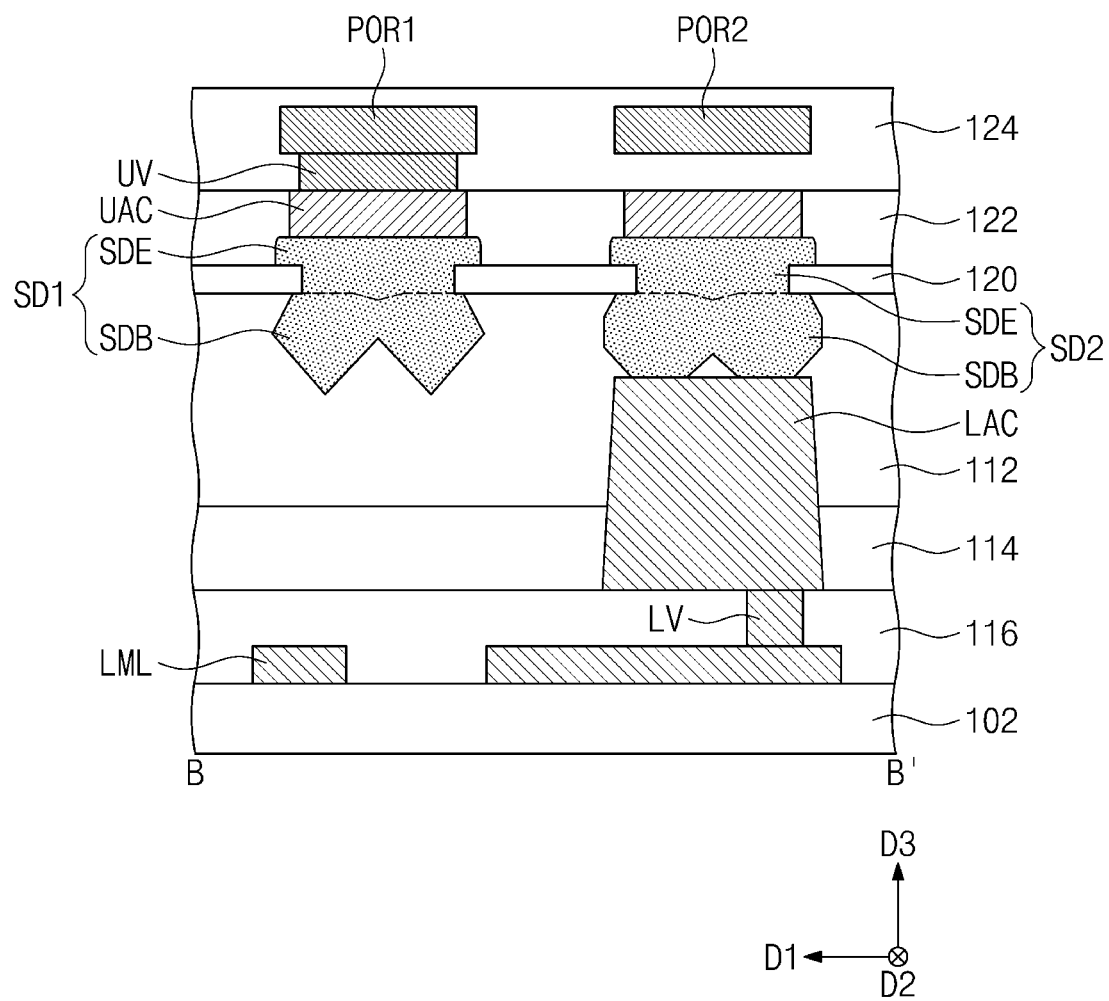

FIGS. 4A and 4B are cross-sectional views taken along line A-A' of FIG. 1 illustrating a semiconductor device according to an exemplar) embodiment of the inventive concept.

Referring to FIG. 4A, the second portion SDE of the first source-drain pattern SD1 may include first and second members SDE-1, SDE-2, which are spaced apart from each other in the first direction D1. Each of the first and second members SDE-1, SDE-2 may penetrate the first upper insulating layer 120 and may be connected to the first portion SDB of the first source/drain pattern SD1. The portions of the first and second members SDE-1, SDE-2 of the second portion SDE that penetrate the first upper insulating layer 120 may have a width (e.g., a length in the first direction D1) that is narrower than the portion of the first and second members that are disposed above the first upper insulating layer.

Referring to the exemplary embodiment shown in FIG. 4B, the second portion SDE of the first source/drain pattern SD1 may be connected to the first portion SDB of the first source/drain pattern SD1 through one opening formed in the first upper insulating layer 120. Therefore, the first and second portions SDB and SDE of the first source/drain pattern SD1 may be seamlessly connected to each other, without the first upper insulating layer 120 or the first lower insulating layer 112 interposed therebetween.

Figure 5:
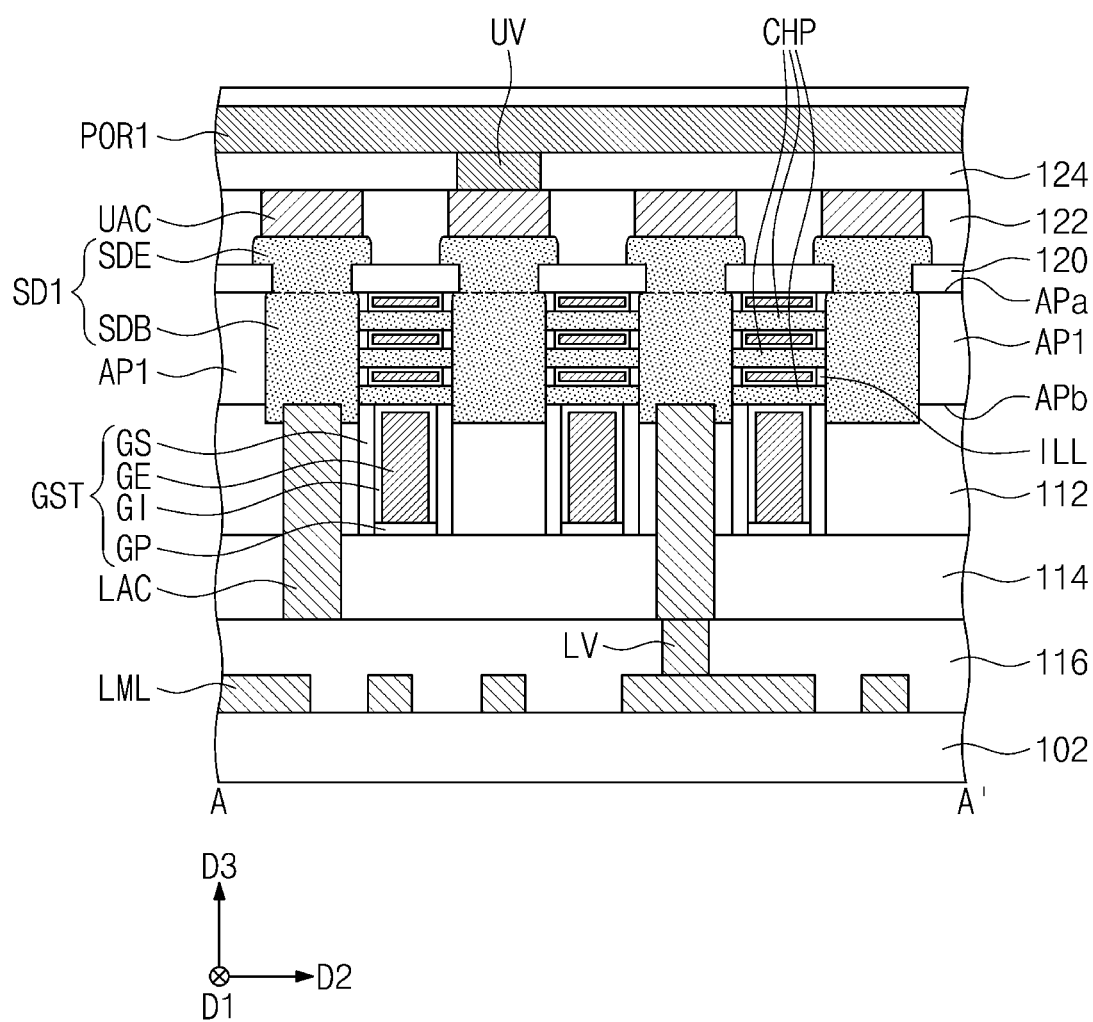
FIG. 5 is a cross-sectional view taker along a line A-A' of FIG. 1 illustrating a semiconductor device according to an exemplary embodiment of the present inventive concepts.

FIG. 5 is a cross-sectional view taken along line A-A' of FIG. 1 illustrating a semiconductor device according to an exemplary embodiment of the present inventive concepts.

Referring to FIG. 5, a semiconductor device according to an exemplary embodiment of the present inventive concepts may have a gate-all-around structure. For example, the first active pattern AP1 may include a plurality of channel regions CHP, which are interposed between adjacent source/drain patterns SD1. The channel regions CHP may be stacked and vertically spaced apart from each other. Insulation patterns ILL may be interposed between the first source/drain patterns SD1 and the gate electrodes GE. The insulation patterns ILL may be interposed between the channel regions CHP. The insulating patterns ILL may electrically isolate the gate electrode GE front the first source/drain patterns SD1.

FIGS. 6, 8, 10, 12, 14, and 16 are top plan views illustrating a method of fabricating a semiconductor device according to exemplary embodiments of the present inventive concepts. FIGS. 7A, 9A, 11A, 13A, 15A, and 17A are cross-sectional views taken along lines A-A' of FIGS. 6, 8, 10, 12, 14, and 16, respectively FIGS. 7B, 9B, 11B, 13B, 15B, and 17B are cross-sectional views taken along lines B-B' of FIGS. 6, 8, 10, 12, 14, and 16, respectively.

For convenience of explanation with respect to a method of fabricating a semiconductor device according to exemplary embodiments of the present inventive concepts, a capsized shape of a semiconductor device is illustrated in FIGS. 6 to 11B. However, exemplary embodiments of the present inventive concepts are not limited thereto.

Figure 6:
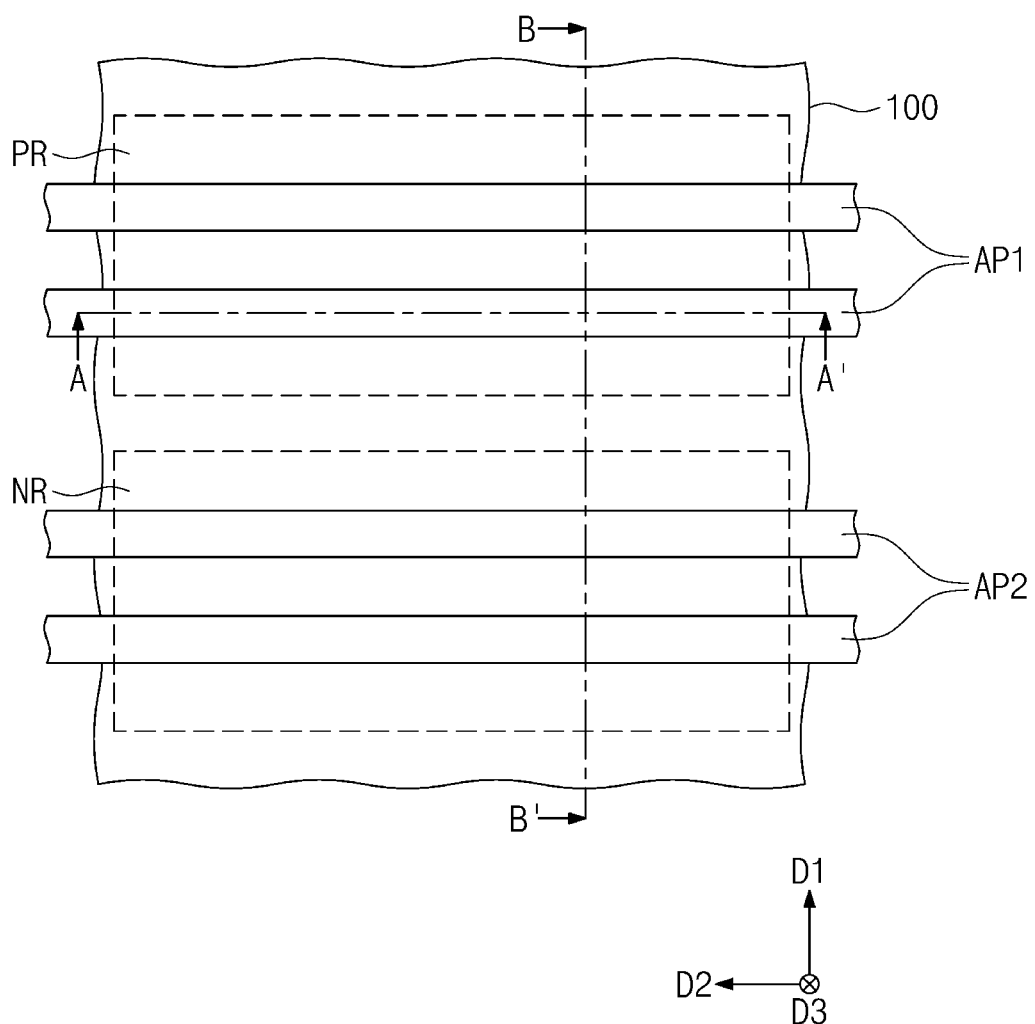
FIGS. 6, 8, 10, 12, 14, and 16 are top plan views illustrating a method of fabricating a semiconductor device according to exemplary embodiments of the present inventive concepts.
Figure 7A:
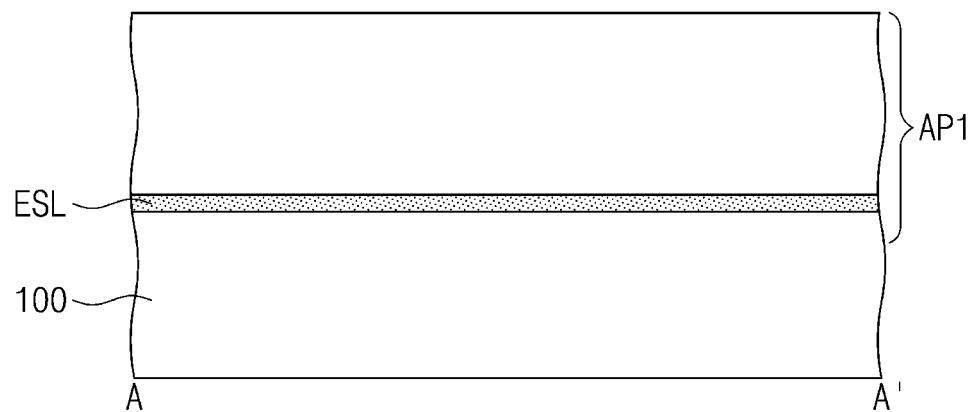
FIGS. 7A, 9A, 11A, 13A, 15A, and 17A are cross-sectional views taken along lines A-A' of FIGS. 6, 8, 10, 12, 14, and 16, respectively, according to exemplary embodiments of the present inventive concepts.
Figure 7B:
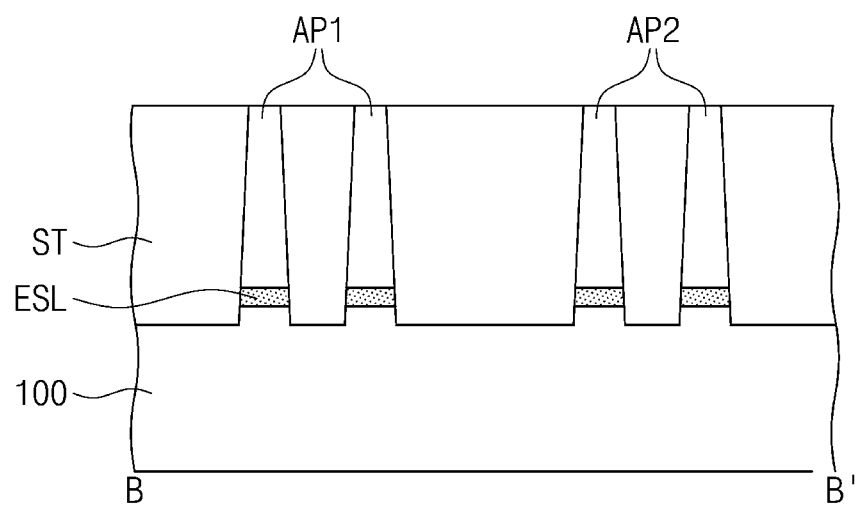
FIGS. 7B, 9B, 11B, 13B, 15B, and 17B are cross-sectional views taken along lines B-B' of FIGS. 6, 8, 10, 12, 14, and 16, respectively, according to exemplary embodiments of the present inventive concepts.

Referring to FIGS. 6, 7A, and 7B, a substrate 100 including the first and second active patterns AP1 and AP2 may be formed. The substrate 100 may include an etch stop layer ESL.

In an exemplary embodiment, an ion implantation process and/or an epitaxial growth process may be performed on a semiconductor layer to form the etch stop layer ESL. Thereafter, the substrate 100 including the etch stop layer ESL may be formed by growing a semiconductor layer on the etch stop layer ESL. In an exemplary embodiment, the substrate 100 may be formed of or include silicon and silicon germanium. However, exemplary embodiments of the present inventive concepts we not limited thereto.

The substrate 100 including the etch stop layer ESL may be patterned to form the first and second active patterns AP1 and AP2. The etch stop layer ESL may be positioned below the first and second active patterns AIM and AP2.

A device isolation layer ST may be formed on the substrate 100 to fill gap regions between the first and second active patterns AP1 and AP2. The device isolation layer ST may be formed of or include an insulating material, such as silicon oxide. However, exemplary embodiments of the present inventive concepts are not limited thereto.

Figure 8:
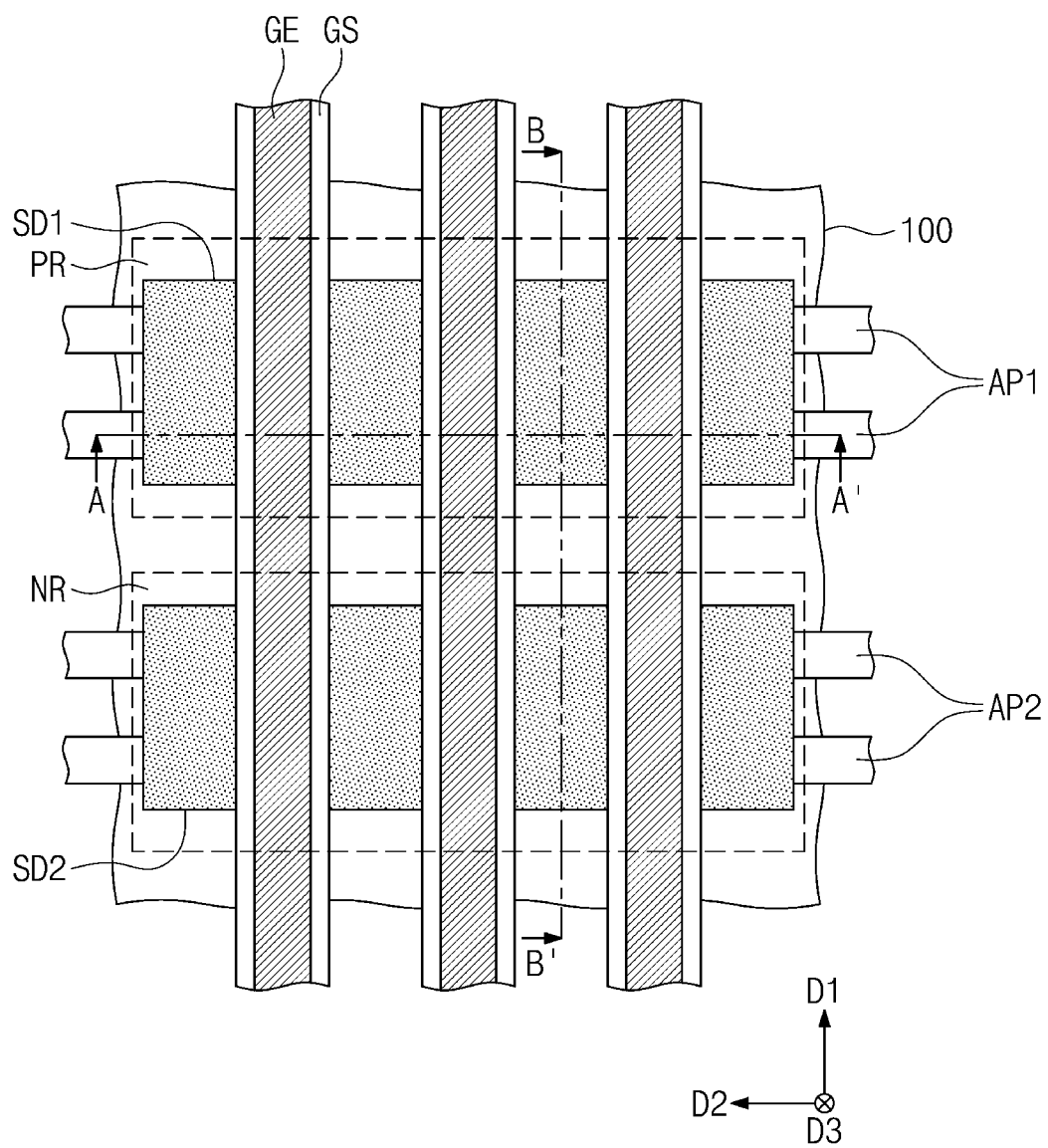
Figure 9A:
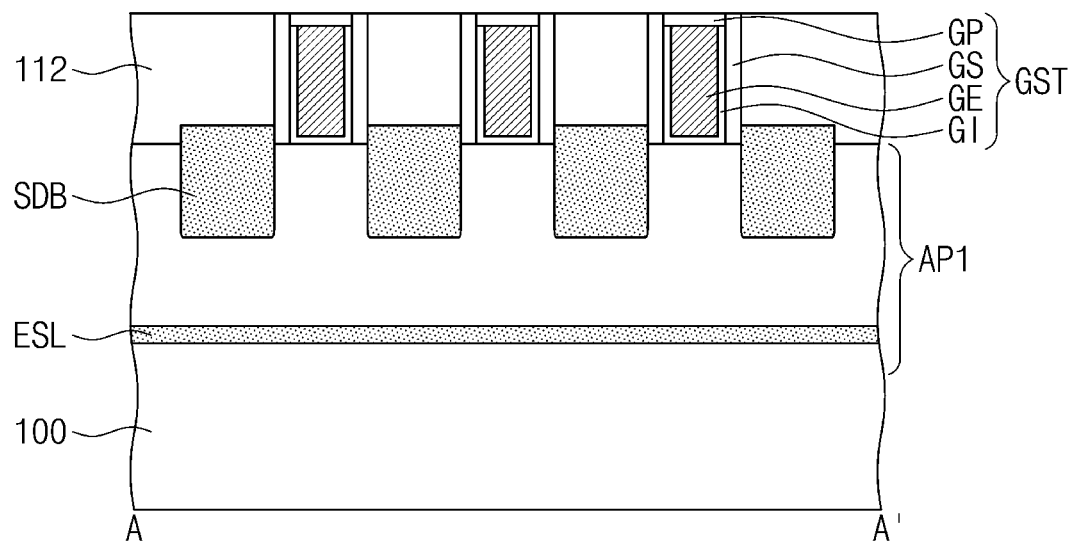
Figure 9B:
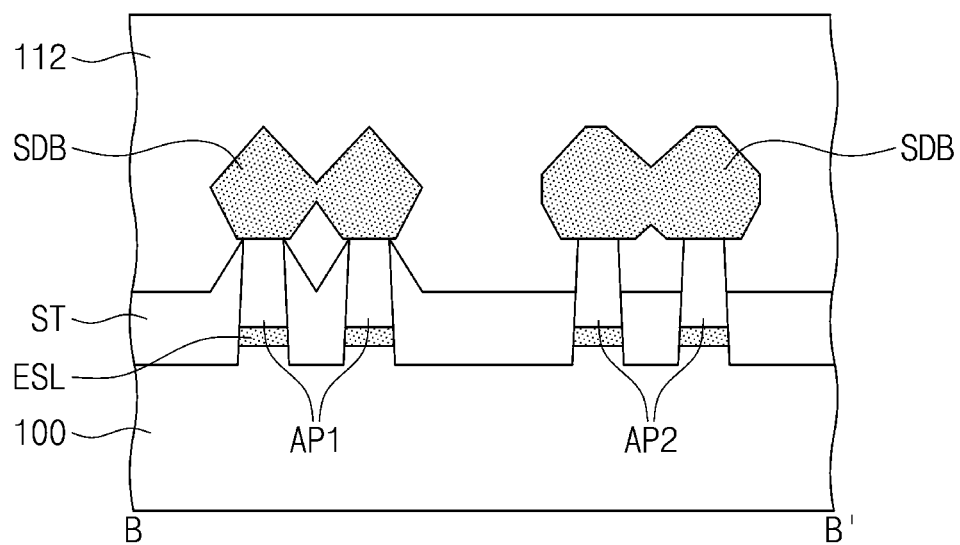

Referring to FIGS. 8, 9A, and 9B, the first and second source/drain patterns SD1 and SD2 and a gate structure GST may be formed on the first active patterns AP1.

For example, the first portions SDB of the first source/drain patterns SD1 may be formed on the first active patterns AP1. As shown in the exemplary embodiment of FIG. 9A, the first portions SDB of the first source/drain patterns SD1 may be formed directly on the first active patterns AP1. The first portions SDB of the second source/drain patterns SD2 may be formed on the second active patterns AP2. Fa example, the first portions SDB of the second source/drain patterns SD2 may be formed directly on the second active patterns AP2. The first portions SDB of the first source/drain patterns SD1 may be doped with p-type impurities, and the first portions SDB of the second source/drain patterns SD2 may be doped with n-type impurities. However, exemplary embodiments of the present inventive concepts are not limited thereto. For example, in other exemplary embodiments, the first portions SDB of the first source/drain patterns SD1 may be doped with n-type impurities, and the first portions SDB of the second source/drain patterns SD2 may be doped with p-type impurities.

The first portions SDB of the first and second source/drain patterns SD1 and SD2 may be epitaxial patterns, which are formed by a selective epitaxial growth process. For example, the first and second active patterns AP1 and AP2 may be partially recessed. An epitaxial growth process may be subsequently performed on the recessed portions of the first and second active patterns AP1 and AP2. The first lower insulating layer 112 may be formed to cover the first portions SDB of the first and second source-drain patterns SD1 and SD2.

Thereafter, the gate electrodes GE may be formed to cross the first and second active patterns AP1 and AP2 and to extend in the first direction D1. The gate dielectric layers GI may be formed between the gate electrodes GE and the first and second active patterns AP1, AP2, respectively. The gate spacers GS may be formed on both side surfaces of each of the gate electrodes GE. Gate capping layers GP may be formed on the gate electrodes GE, respectively.

Figure 10:
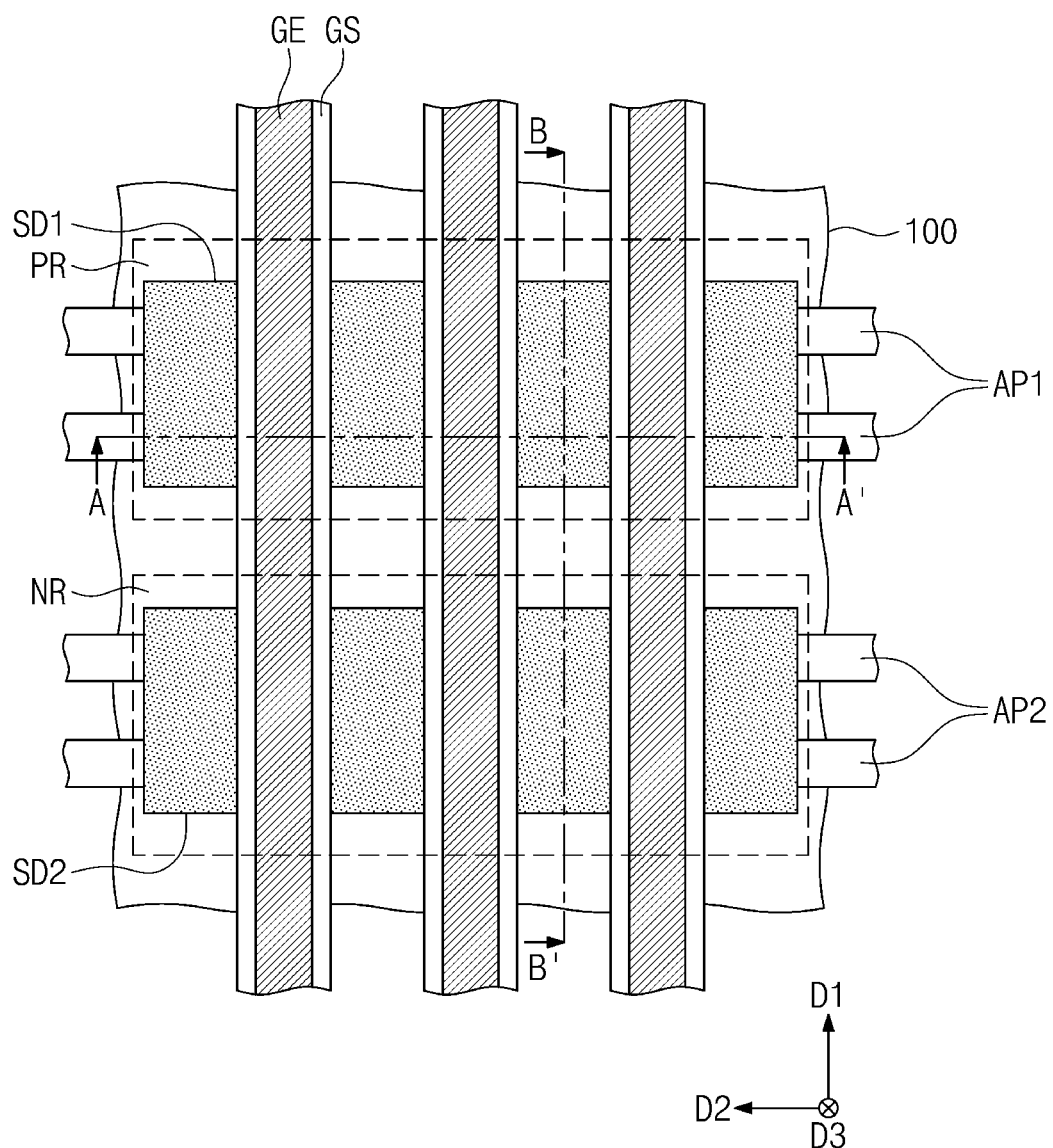
Figure 11A:
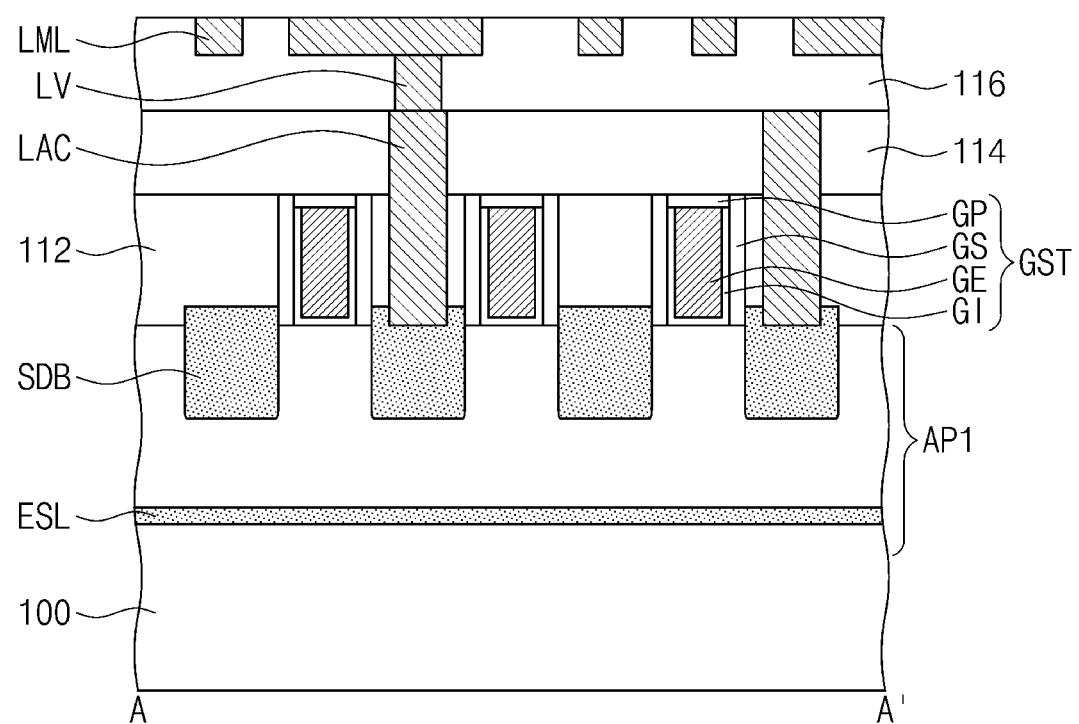
Figure 11B:
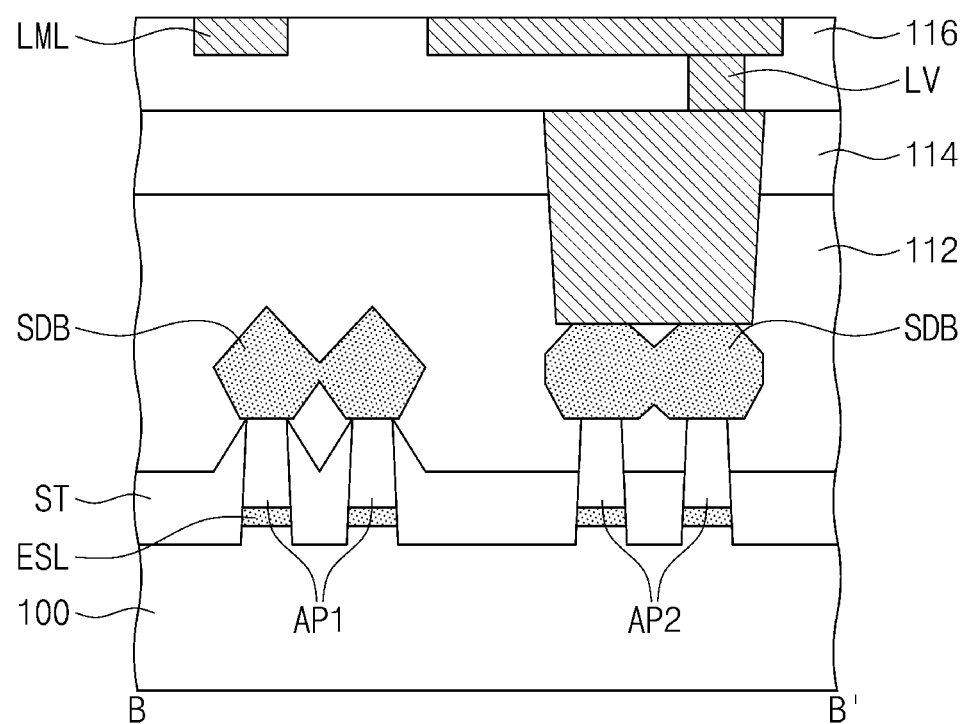

Referring to FIGS. 10, 11A, and 11B, the lower interconnection lines LML may be formed to be electrically connected to the first portions SDB of the first and second source/drain patients SD1 and SD2. For example, the second lower insulating layer 114 may be formed on the first lower insulating layer 112. The lower contact LAC may be formed to penetrate the first lower insulating layer 112 and the second lower insulating layer 114 and may be coupled to the first portions SDB of the first and second source/drain patterns SD1 and SD2.

The third lower insulating layer 116 may be formed on the second lower insulating layer 114. For example, a bottom surface of the third lower insulating layer 116 may be formed directly on a top surface of the second lower insulating layer 114. The lower interconnection lines LML and the lower vias LV, which connect the lower interconnection lines LML to the lower contact LAC, may be formed in the third lower insulating layer 116.

Figure 12:
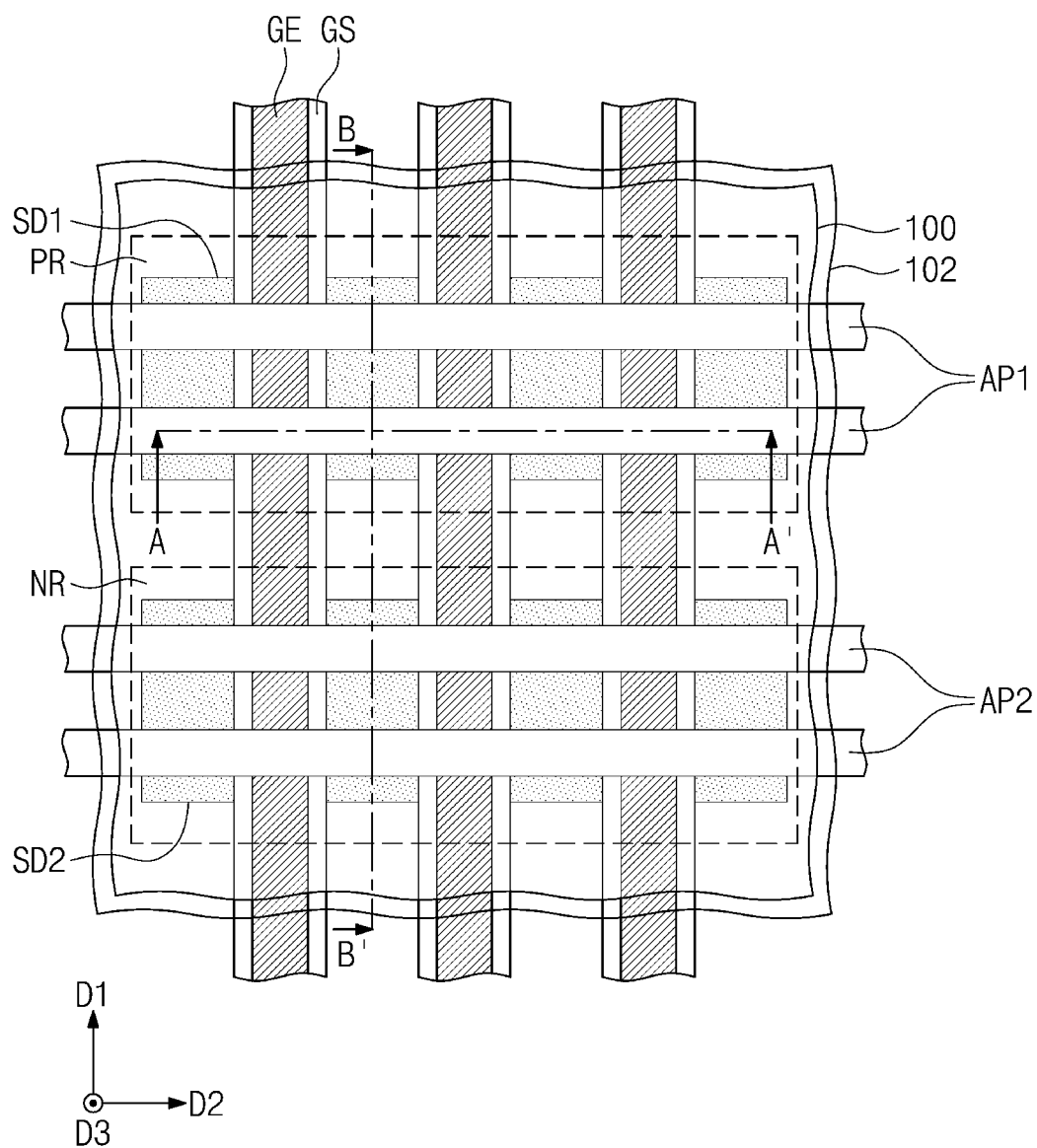
Figure 13A:
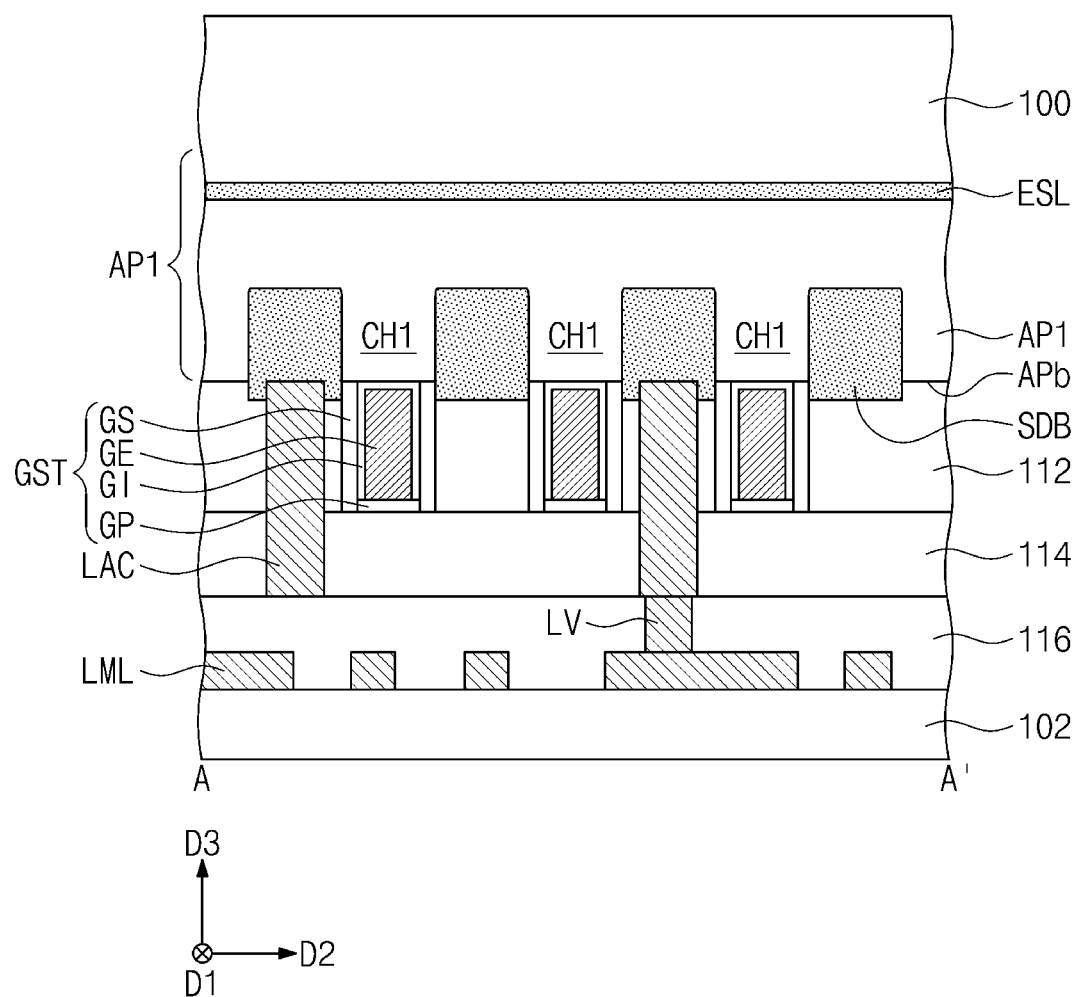
Figure 13B:
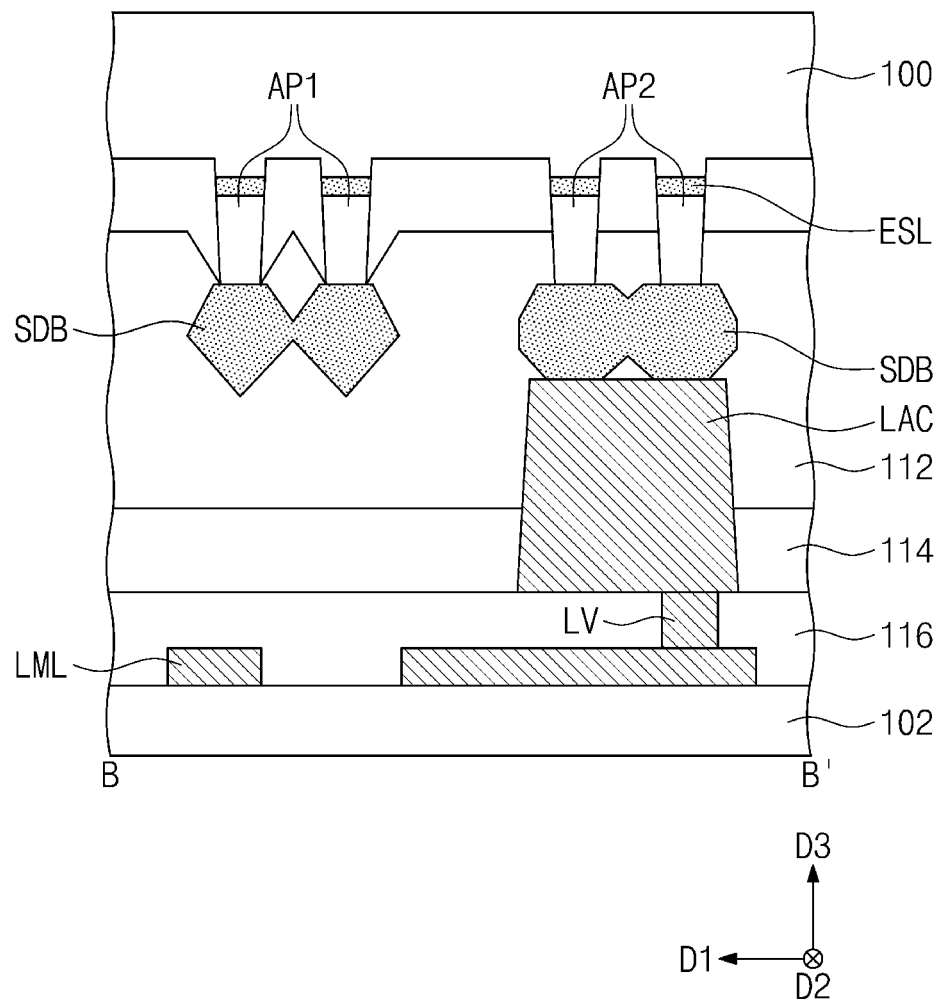

Referring to FIGS. 12, 13A, and 13B, the lower substrate 102 may be formed. A wafer bonding process may be performed such that a bottom surface (e.g., in the third direction D3) of the third lower insulating layer 116 faces the top surface of the lower substrate 102. The lower substrate 102 may be a carrier substrate or an interconnection substrate. In an exemplary embodiment in which the lower substrate 102 is an interconnection substrate, interconnection lines in the lower substrate 102 may be electrically connected to the lower interconnection lines LML.

Figure 14:
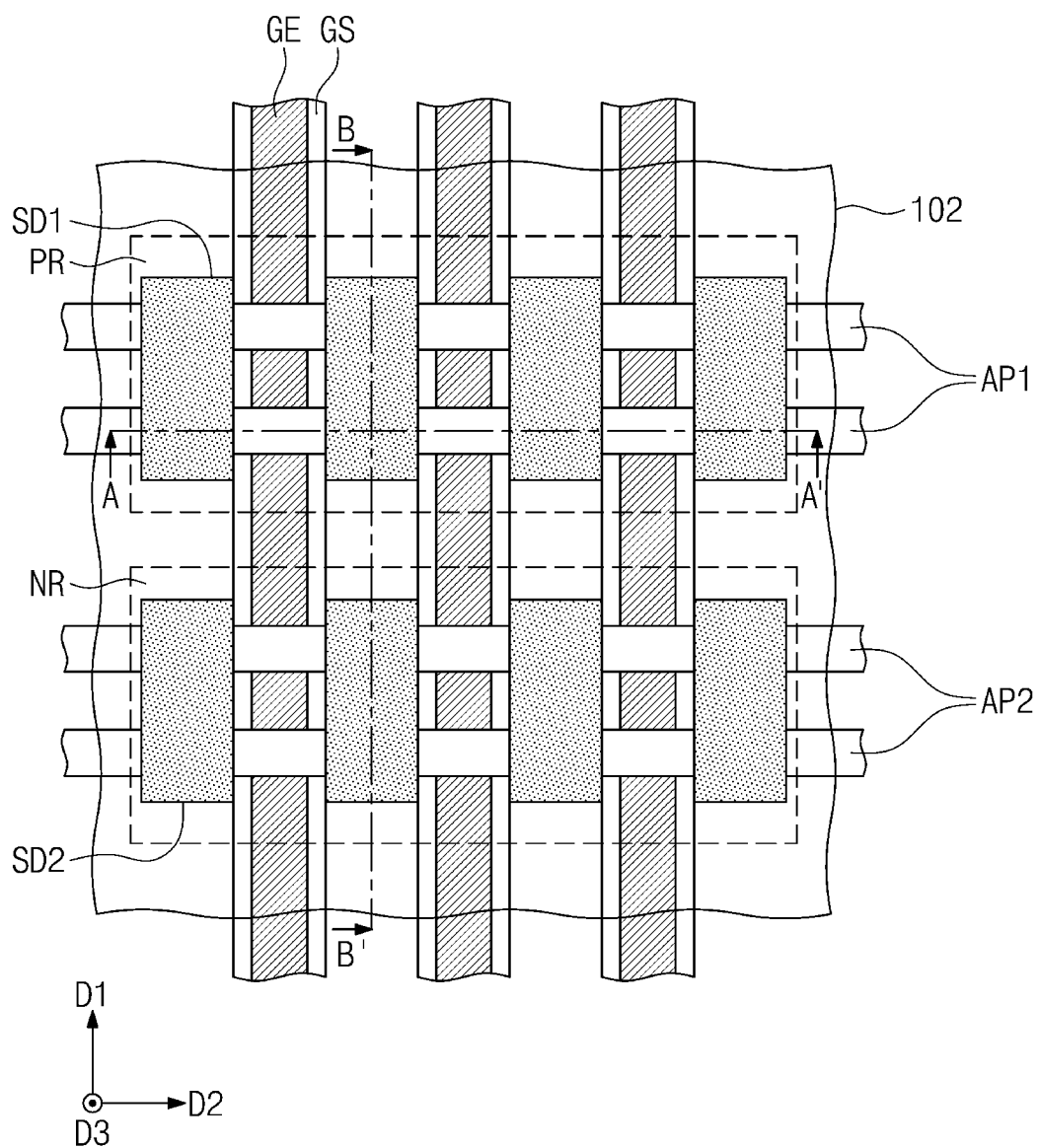
Figure 15A:
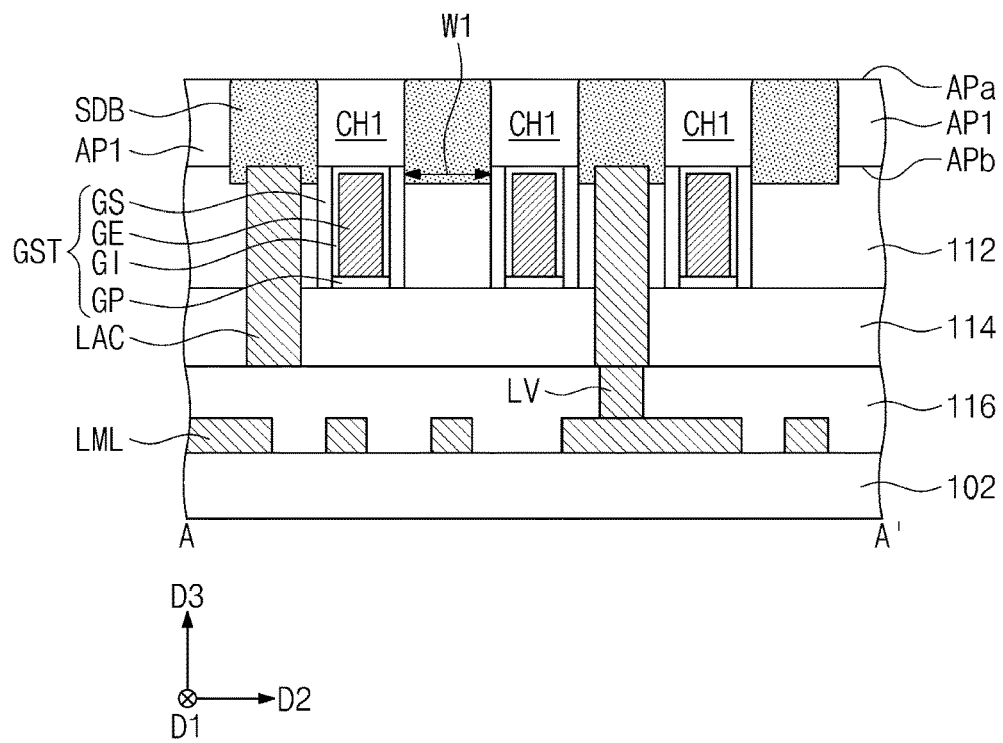
Figure 15B:
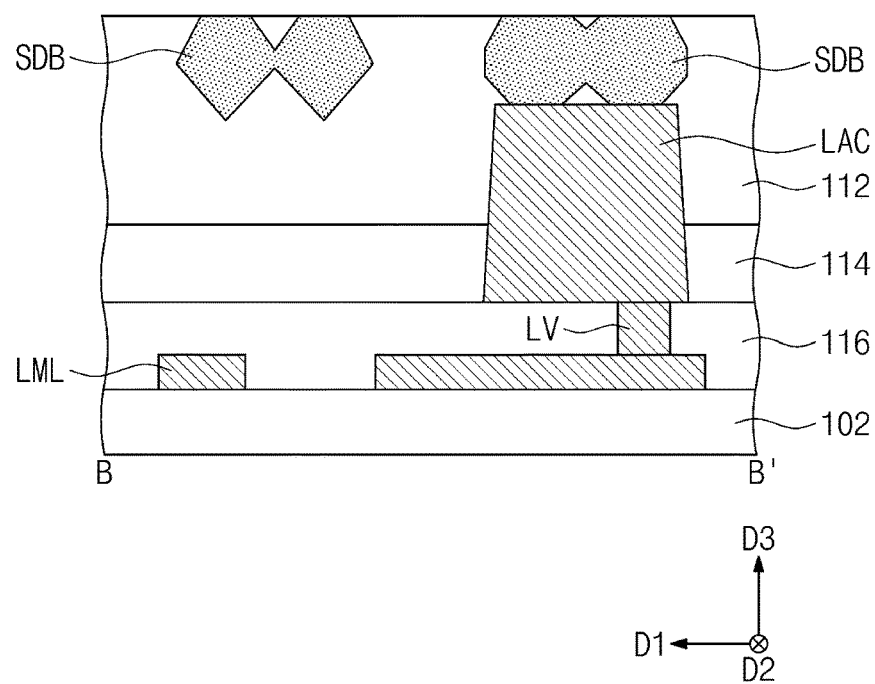

Referring to FIGS. 14, 15A, and 15B, a portion of the substrate 100 may be removed to expose the first portions SDB of the first and second source/drain patterns SD1 and SD2.

For example, the partial removal of the substrate 100 may include performing an etching process to expose the etch stop layer ESL and performing a CMP process to expose the top surfaces of the first portions SDB of the first and second source/drain patterns SD1 and SD2.

In an exemplary embodiment, as a result of the partial removal of the substrate 100, the first active patterns AP1 may be divided into a plurality of patterns arranged in the second direction D2. For example, as shown in FIG. 15A, one first active pattern AP1 including one channel region CH1 may be disposed between opposite sidewalls of the first and second source/drain patients SD1 and SD2.

Figure 16:
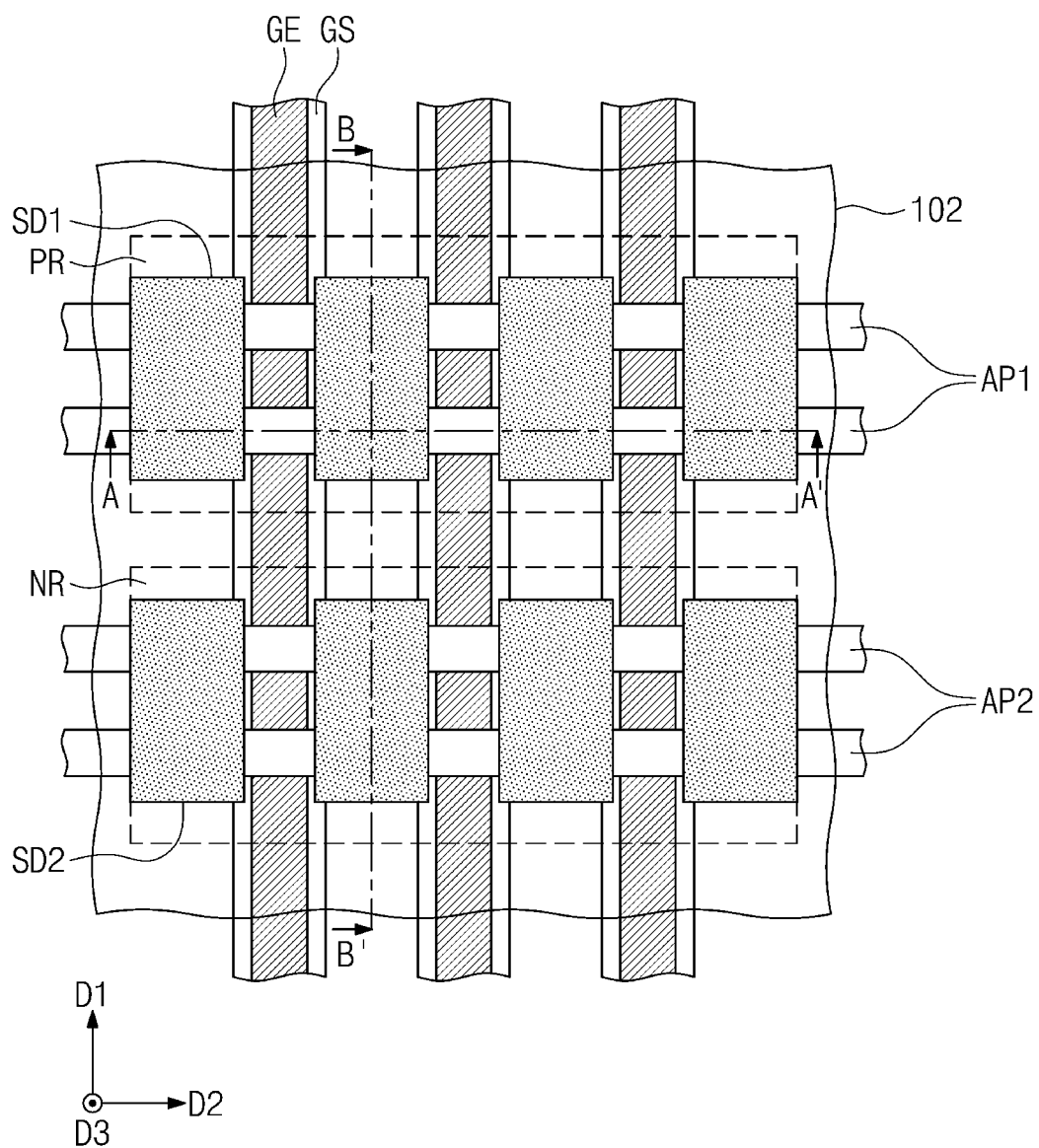
Figure 17A:
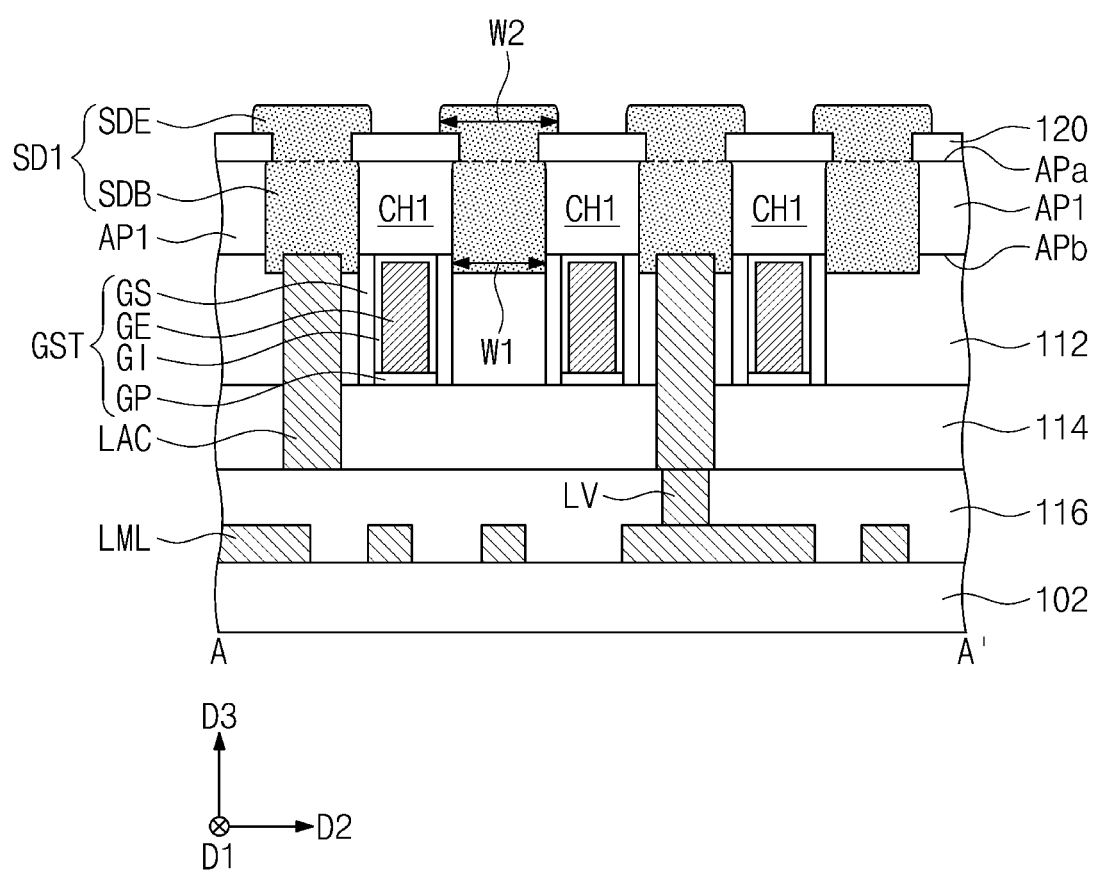
Figure 17B:
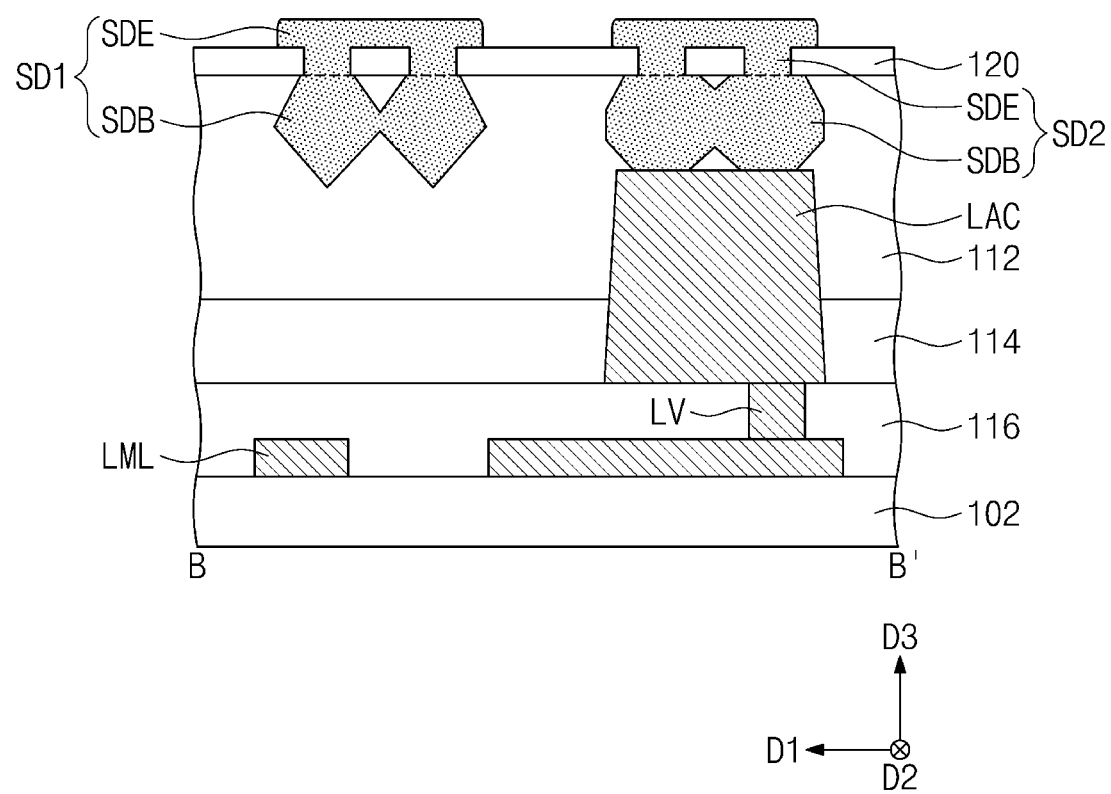

Referring to FIGS. 16, 17A, and 17B, the second portions SDE of the first and second source/drain patterns SD1 and SD2 may be formed on the first portions SDB of the first and second source/drain patterns SD1 and SD2. For example, a bottom surface (e.g., in the third direction D3) of the second portions SDE of the first and second source/drain patterns SD1 and SD2 may be formed directly on a top surface (e.g., in the third direction D3) of the first portions SDB of the first and second source/drain patterns. The second portions SDE of the first and second source/drain patterns SD1 and SD2 may be epitaxial patterns, which are grown from the first portions SDB of the first and second source/drain patterns SD1 and SD2.

For example, the first upper insulating layer 120 may be formed on the first and second active patterns AP1 and AP2 and the first and second source/drain patterns SD1 and SD2. Thereafter, a patterning process may be performed on the first upper insulating layer 120 to form openings exposing top surfaces of the first portions SDB of the first and second source/drain patterns SD1 and SD2. Next, an epitaxial growth process may be performed to form the second portions SDE of the first and second source/drain patterns SD1 and SD2. The epitaxial growth process may be performed such that the width W2 of the second portions SDE of the first and second source/drain patterns SD1 and SD2 is larger than the width W1 of the first portions SDB of the first and second source/drain patterns SD1 and SD2.

Referring back to FIGS. 1, 2A, and 2B, rite second upper insulating layer 122 may be formed on the first upper insulating layer 120. For example, a bottom surface of the second upper insulating layer 122 (e.g., in the third direction D3) may be disposed directly on a top surface of the first upper insulating layer 120. The upper contacts UAC may be formed to penetrate the second upper insulating layer 122. The upper contacts UAC may be respectively coupled to the second portions SDE of the first and second source/drain patterns SD1 and SD2.

The third upper insulating layer 124 may be formed on the second upper insulating layer 122 to cover the upper contacts UAC. The lint and second upper interconnection lines POR1 and POR2 and the upper via UV may be formed in the third upper insulating layer 124. The upper via UV may be formed to electrically connect the first and second upper interconnection lines POR1 and POR2 to at least one upper contact UAC.

In a semiconductor device according to an exemplary embodiment of the inventive concept, a power transfer network is stably formed on a second surface of a semiconductor substrate. As a result, it may be possible to increase the reliability and integration density of the semiconductor device.

While exemplary embodiments of the present inventive concepts have been particularly shown and described, it will be understood by one of ordinary skill in the art that variations in form and detail may be made therein without departing from the spirit and scope of the attached claims.

What is claimed is:

1. A semiconductor device, comprising:
an active pattern including a channel region, the channel region disposed between first and second source/drain patterns that are spaced apart from each other in a first direction, the first and second source/drain patterns including impurities of a first conductivity type the channel region configured to connect the first and second source/drain patterns to each other;
a gate electrode on a bottom surface of the active pattern and disposed between the first and second source/drain patterns; and
an upper interconnection line disposed on a top surface of the active pattern opposite to the bottom surface of the active pattern and connected to the first sources/drain pattern,
wherein uppermost surfaces of the first and second sources drain patterns are positioned at a higher level than an uppermost surface of the channel region disposed therebetween.

2. The device of claim 1, wherein the first source/drain pattern has a largest width in the first direction at a level higher than a level of the top surface of the active pattern.

3. The device of claim 1, further comprising:
an upper contact coupled to a top surface of the first source/drain pattern; and
a lower contact coupled to a bottom surface of the second source/drain pattern.

4. The device of claim 3, wherein, a bottom surface of the upper contact adjacent to the top surface of the first source/drain pattern has a width in the first direction that is larger than a width of a top surface of the lower contact adjacent to the bottom surface of the second source/drain pattern in the first direction.

5. The device of claim 1, wherein the first source/chain pattern comprises:
a first portion that is adjacent to a side surface of the active pattern; and
a second portion that is extended from the first portion and protrudes above the top surface of the active pattern,
wherein the second portion has a width in the first direction that is larger than a width of the first portion in the first direction.

6. The device of claim 1, further comprising:
a gate spacer on a sidewall of the gate electrode,
wherein the first and second source/drain patterns overlap the gate spacer when viewed in a plan view.

7. The device of claim 1, wherein the upper interconnection line comprises a power rail.

8. The device of claim 1, Wherein the upper interconnection line is extended parallel to the first direction.

9. The device of claim 1, wherein the upper interconnection line overlaps the first and second source/drain patterns when viewed in a plan view.

10. The device of claim 1, further comprising:
a semiconductor substrate provided below the gate electrode;
an interlayer insulating layer between the gate electrode and the semiconductor substrate; and
lower interconnection lines disposed in the interlayer insulating layer and connected to at least one of the first and second source/drain patterns.

11. The device of claim 1, wherein the active pattern comprises a plurality of stacked semiconductor patterns that are vertically spaced apart from each other.

12. A semiconductor device, comprising:
first and second source/drain patterns that are spaced apart from each other in a first direction, the first and second source/drain patterns including impurities of a first conductivity type;
an active pattern disposed between oposing sidewalls of the first and second source/drain patterns;
a gate electrode on a bottom surface of the active pattern;
an insulating layer on a top surface of the active pattern; and an upper interconnection line disposed on the insulating layer and electrically connected to the first source/drain pattern, wherein the first source/drain pattern comprises a first portion that is adjacent to a side surface of the active pattern and a second portion that extends from the first portion into the insulating layer, and a largest width of the first portion in the first direction is smaller than a largest width of the second portion in the first direction.

13. The device of claim 12, wherein the upper interconnection line is extended in a second direction crossing the first direction and at least partially overlaps with each of the first and second source/drain patterns.

14. The device of claim 12, further comprising:
a gate spacer on a sidewall of the gate electrode,
wherein the first and second source/drain patterns overlap the gate spacer when viewed in a plan view.

15. The device of claim 12, wherein the upper interconnection line comprises a power rail.

16. A semiconductor device, comprising:
a substrate including a PMOS region and an NMOS region;
a plurality of first active regions provided on the PMOS region, the plurality of first active regions extending in a first direction and including a channel region;
a plurality of second active regions provided on the NMOS region, the plurality of second active regions extending in the first direction;
a gate electrode crossing the plurality of first active regions and the plurality of second active regions and extending in a second direction crossing the first direction, a portion of the gate electrode is positioned between bottom surfaces of the first active regions and a top surface of the substrate;
first source/drain patterns that are spaced apart from each other in the first direction and having the gate electrode interposed therebetween, the first source/drain patterns are connected to the plurality of first active regions, the first source/drain patterns including impurities of a first conductivity type, the channel region is disposed between the first source/drain patterns; and
an upper interconnection line disposed on a top surface of the first active region opposite to the bottom surface of the first active region,
wherein the upper interconnection line is connected to at least a portion of the first source/drain patterns, and
wherein an uppermost surface of the first source/drain patterns is positioned at a higher level than an uppermost surface of the channel region disposed therebetween.

17. The device of claim 16, wherein the upper interconnection line extends in the second direction, and
each of the first source/drain patterns is at least partially overlapped with the upper interconnection line when viewed in a plan view.

18. The device of claim 16, further comprising:
an interlayer insulating layer disposed between the gate electrode and the substrate; and
lower interconnection lines disposed in the interlayer insulating layer and connected to at least a portion of the first source/drain patterns.

19. The device of claim 16, further comprising:
gate spacers on side surfaces of the gate electrode; and
a gate capping pattern between the gate spacers, the gate capping pattern disposed on a bottom surface of the gate electrode.

20. The device of claim 16, wherein the plurality of first active regions have a fin shape protruding in a third direction crossing the first and second directions, and
lengths of the plurality of first active regions in the third direction are smaller than a length of the first source/drain pattern in the third direction.

* * * * *